(12) United States Patent
Song et al.

(10) Patent No.: US 11,520,435 B2
(45) Date of Patent: Dec. 6, 2022

(54) TOUCH STRUCTURE AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Gukhwan Song, Beijing (CN); Youngyik Ko, Beijing (CN); Ping Wen, Beijing (CN); Yi Zhang, Beijing (CN); Tingliang Liu, Beijing (CN); Chang Luo, Beijing (CN); Shun Zhang, Beijing (CN); Yuanqi Zhang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/462,608

(22) Filed: Aug. 31, 2021

(65) Prior Publication Data

US 2022/0129134 A1 Apr. 28, 2022

(30) Foreign Application Priority Data

Oct. 26, 2020 (CN) .......................... 202011156803.8

(51) Int. Cl.
*G06F 3/041* (2006.01)
*G06F 3/044* (2006.01)
*H01L 27/32* (2006.01)

(52) U.S. Cl.
CPC ........ *G06F 3/04164* (2019.05); *G06F 3/0412* (2013.01); *G06F 3/0445* (2019.05); *G06F 3/0446* (2019.05); *G06F 2203/04107* (2013.01); *G06F 2203/04111* (2013.01); *H01L 27/323* (2013.01)

(58) Field of Classification Search
CPC combination set(s) only.
See application file for complete search history.

(56) References Cited

U.S. PATENT DOCUMENTS

2013/0106747 A1* 5/2013 Choi ..................... G06F 3/0446
345/173

\* cited by examiner

*Primary Examiner* — Deeprose Subedi
(74) *Attorney, Agent, or Firm* — Dority & Manning, P.A.

(57) ABSTRACT

A touch structure includes first touch units and second touch units located in a touch area, first conductive lines and at least one second conductive line. Each first conductive line is connected to one first touch unit and led out from a third peripheral sub-area. Each second conductive line is connected to one second touch unit, led out from a first peripheral sub-area and passes through the third peripheral sub-area. Part of the second conductive line located in the third peripheral sub-area is further away from the touch area than part of the first conductive lines located in the third peripheral sub-area. At least one first conductive line is further away from the touch area in a first direction than another first conductive line, and lead-out position of the at least one first conductive line is closer to a second peripheral sub-area than that of the another first conductive line.

19 Claims, 15 Drawing Sheets

TOUCH STRUCTURE AND DISPLAY APPARATUS

CROSS-REFERENCE TO RELATED APPLICATION

This application claims priority to Chinese Patent Application No. 202011156803.8, filed on Oct. 26, 2020, which is incorporated herein by reference in its entirety.

TECHNICAL FIELD

The present disclosure relates to the field of touch technologies, and in particular, to a touch structure and a display apparatus.

BACKGROUND

With the rapid development of electronic display technologies, a touch technology has been applied. In the touch technology, a touch structure is usually composed of a plurality of driving units and a plurality of sensing units. The driving units are used for transmitting driving signals and may also be called signal transmitting channels (i.e., Tx channels), and the sensing units are used for transmitting sensing signals generated in response to touches and may also be called signal receiving channels (i.e., Rx channels).

SUMMARY

In an aspect, a touch structure is provided. The touch structure has a touch area and a peripheral area surrounding the touch area. The peripheral area includes a first peripheral sub-area and a second peripheral sub-area opposite to each other, and a third peripheral sub-area. Both ends of the third peripheral sub-area is respectively connected to the first peripheral sub-area and the second peripheral sub-area. The touch structure further has a bonding region located in the second peripheral sub-area.

The touch structure includes a plurality of first touch units, a plurality of second touch units, a first conductive line group and a second conductive line group.

The plurality of first touch units extends in a first direction and the plurality of second touch units extends in a second direction, and the plurality of first touch units and the plurality of second touch units are located in the touch area. The first direction intersects with the second direction.

The first conductive line group is located in the touch area, and includes a plurality of first conductive lines, each first conductive line is electrically connected to one of the plurality of first touch units, the first conductive line is led out from the third peripheral sub-area and extends to the bonding region.

The second conductive line group is located in the touch area, and includes at least one second conductive line, each second conductive line is electrically connected to one of the plurality of second touch units. The second conductive line is led out from the first peripheral sub-area, passes through the third peripheral sub-area and extends to the bonding region. Part of the second conductive line group located in the third peripheral sub-area is further away from the touch area than part of the first conductive line group located in the third peripheral sub-area.

In the plurality of first conductive lines, at least one first conductive line is further away from the touch area in the first direction than another first conductive line, and a lead-out position of the at least one first conductive line is closer to the second peripheral sub-area than a lead-out position of the another first conductive line.

In some embodiments, in any two first conductive lines of the first conductive line group, one first conductive line having a lead-out position closer to the second peripheral sub-area is further away from the touch area in the first direction than another first conductive line.

In some embodiments, the first conductive line includes a first lead-out section, a first extension section and a first connection section sequentially connected. An end of the first lead-out section away from the first extension section is electrically connected to the first touch unit, the first extension section extends in the third peripheral sub-area, and the first connection section extends to the bonding region.

In some embodiments, in any two first conductive lines of the first conductive line group, a first extension section of one first conductive line having a lead-out position closer to the second peripheral sub-area is further away from the touch area in the first direction than a first extension section of another first conductive line. Lengths of the first extension sections of the plurality first conductive lines increase in a direction from the third peripheral sub-area to the touch area.

In some embodiments, lengths of first lead-out sections of the plurality of first conductive lines increase in a direction from the first peripheral sub-area to the second peripheral sub-area.

In some embodiments, in the any two first conductive lines of the first conductive line group, a first lead-out section of the one first conductive line having the lead-out position closer to the second peripheral sub-area and the first extension section of the another first conductive line cross and are insulated from each other.

In some embodiments, in any two first conductive lines of the first conductive line group, a first connection section of one first conductive line having a lead-out position closer to the second peripheral sub-area is further away from the touch area in the second direction than a first connection section of another first conductive line.

In some embodiments, the first conductive line includes a first conductive sub-line and a second conductive sub-line located in different layers in a thickness direction of the touch structure and electrically connected, an orthogonal projection of the first conductive sub-line on a reference plane overlaps with an orthogonal projection of the second conductive sub-line on the reference plane, the reference plane is a plane where the touch structure is located. The touch structure further includes an insulating layer located between a layer where the first conductive sub-line is located and a layer where the second conductive sub-line is located. The first conductive sub-line is electrically connected to the second conductive sub-line through via holes provided in the insulating layer.

In some embodiments, the at least one first conductive line crosses the another first conductive line. In two crossing first conductive lines, a first conductive sub-line of one first conductive line has a first break at a crossing position, and a second conductive sub-line of another first conductive line has a second break at the crossing position.

In some embodiments, the touch structure further includes at least one bridge portion and at least one insulating portion. The at least one first conductive line crosses the another first conductive line. In two crossing first conductive lines, one first conductive line is disconnected at a crossing position, and two disconnected portions of the one first conductive line are electrically connected through a respective bridge portion of the at least one bridge portion, and a respective one of the at least one insulating portion is provided between the bridge portion and another of the two crossing first conductive lines.

In some embodiments, a layer where the plurality of first conductive lines are located and a layer where the at least one bridge portion are located are stacked in a thickness direction of the touch structure. The touch structure further includes an insulating layer disposed in the two layers, a portion of the insulating layer located at a crossing position serving as one of the at least one insulating portion.

In some embodiments, the touch structure further includes a first isolation line arranged between the first conductive line group and the second conductive line group, and at least portion of the first isolation line extends in the third peripheral sub-area.

In some embodiments, the peripheral area further includes a fourth peripheral sub-area opposite to the third peripheral sub-area. The touch structure further includes a third conductive line group. The third conductive line group includes a plurality of third conductive lines, and each third conductive line is electrically connected to one of the plurality of first touch units. The third conductive line is led out from the fourth peripheral sub-area and extends to the bonding region.

In some embodiments, the touch structure further includes a fourth conductive line group. The fourth conductive line group includes at least one fourth conductive line, and each fourth conductive line is electrically connected to one of the plurality of second touch units. The fourth conductive line is led out from the first peripheral sub-area, passes through the fourth peripheral sub-area and extends to the bonding region. A portion of the fourth conductive line group located in the fourth peripheral sub-area is further away from the touch area than a portion of the third conductive line group located in the fourth peripheral sub-area.

In some embodiments, in any two third conductive lines of the third conductive line group, one third conductive line having a lead-out position closer to the second peripheral sub-area is further away from the touch area in the first direction than another third conductive line.

In some embodiments, the third conductive line includes a second lead-out section, a second extension section and a second connection section sequentially connected. An end of the second lead-out section away from the second extension section is electrically connected to the first touch unit, the second extension section extends in the fourth peripheral sub-area, and the second connection section extends to the bonding region.

In the any two third conductive lines of the third conductive line group, a second extension section of the one third conductive line having the lead-out position closer to the second peripheral sub-area is further away from the touch area in the first direction than a second extension section of the another third conductive line, and a second lead-out section of the one third conductive line having the lead-out position closer to the second peripheral sub-area and the second extension section of the another third conductive line cross and are insulated from each other.

Lengths of second extension sections of the plurality third conductive lines increase in a direction from the fourth peripheral sub-area to the touch area.

Lengths of second lead-out sections of the plurality of third conductive lines increase in a direction from the first peripheral sub-area to the second peripheral sub-area.

In some embodiments, the touch structure further includes a second isolation line arranged between the third conductive line group and the fourth conductive line group, and at least portion of the second isolation line extends in the fourth peripheral sub-area.

In some embodiments, the at least one second conductive line includes a plurality of second conductive lines, and each of the plurality second touch units is electrically connected to a respective one of the plurality second conductive lines.

In some embodiments, the touch structure further includes a fifth conductive line group. The fifth conductive line group includes a plurality of fifth conductive lines, and each fifth conductive line is electrically connected to an end of one of the plurality of second touch unit proximate to the second peripheral sub-area. The fifth conductive line is led out from the second peripheral area and extends to the bonding region.

In another aspect, a display apparatus is provided. The display apparatus includes a display panel having a light exit surface and the touch structure described above. The touch structure is disposed on the light exit surface, or disposed in the display panel and proximate to the light exit surface.

BRIEF DESCRIPTION OF THE DRAWINGS

In order to describe technical solutions in the present disclosure more clearly, the accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on an actual size of a product involved in the embodiments of the present disclosure.

DETAILED DESCRIPTION

Figure 1:
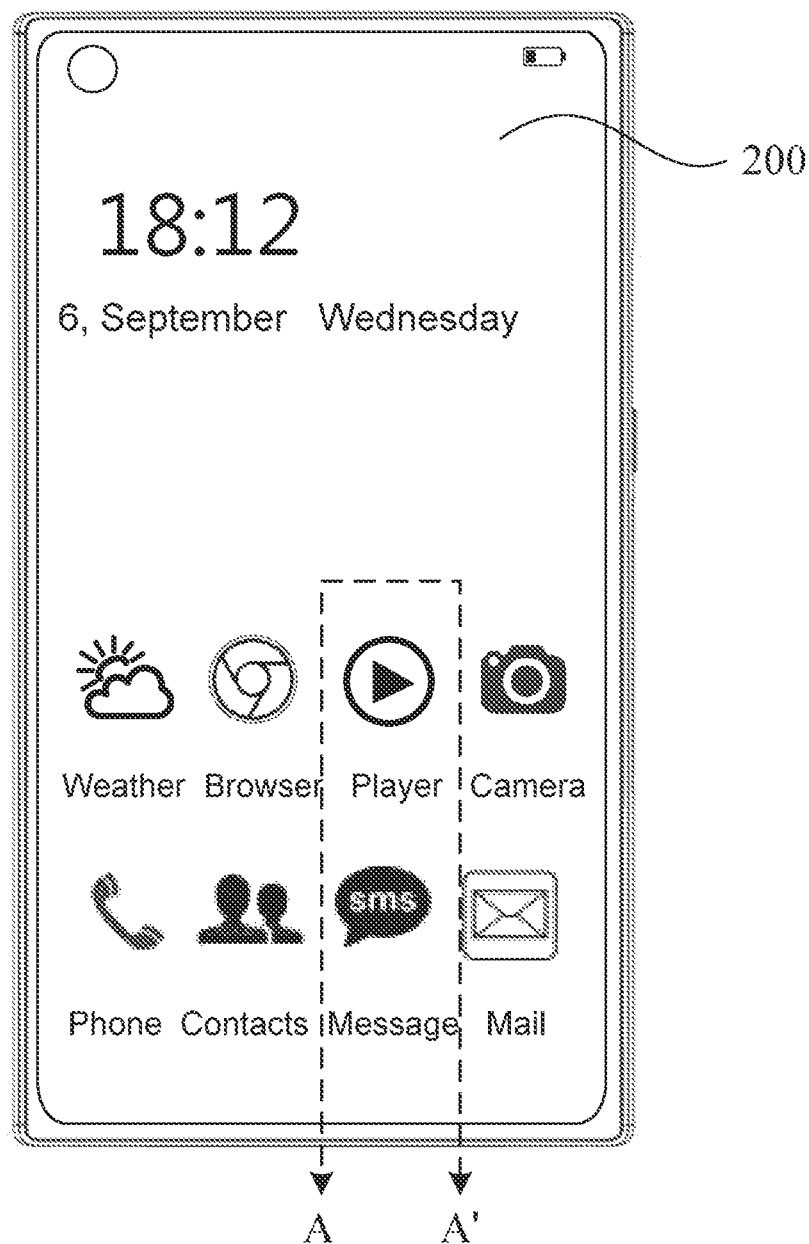
FIG. 1 is a top view of a display apparatus, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first", "second", and so on are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified. As used in this specification and the appended claims, the singular forms "a," "an," and "the" include plural referents unless the content clearly dictates otherwise.

In the description of some embodiments, the terms "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "A and/or B" includes the following three combinations: only A, only B, and a combination of A and B.

The use of the phrase "applicable to" or "configured to" means an open and inclusive expression, which does not exclude apparatuses that are applicable to or configured to perform additional tasks or steps.

Exemplary embodiments are described herein with reference to sectional views and/or plan views as idealized exemplary drawings. In the accompanying drawings, thicknesses of layers and regions are enlarged for clarity. Therefore, variations in shape with respect to the drawings due to, for example, manufacturing technologies and/or tolerances may be envisaged. Therefore, the exemplary embodiments should not be construed as being limited to shapes of the regions shown herein, but including shape deviations due to, for example, manufacture. For example, an etched region shown in a rectangular shape generally has a curved feature. Therefore, the regions shown in the accompanying drawings are schematic in nature, and their shapes are not intended to show actual shapes of the region in a device, and are not intended to limit the scope of the exemplary embodiments.

FIG. 1 shows a top view of a display apparatus. As shown in FIG. 1, some embodiments of the present disclosure provide a display apparatus 100. The display apparatus 100 may be any apparatus having a display function and a touch function such as, a mobile phone, a desktop computer, a notebook computer, a tablet computer, a personal digital assistant (PDA) or a vehicle-mounted computer.

The display apparatus 100 includes a display panel 200. The display panel 200 may be a liquid crystal display (LCD) panel, an electroluminescence display panel or a photoluminescence display panel. In a case where the display panel 200 is an electroluminescence display panel, the electroluminescence display panel may be an organic light-emitting diode (OLED) display panel or a quantum dot light-emitting diode (QLED) display panel. In a case where the display panel 200 is a photoluminescence display panel, the photoluminescence display panel may be a quantum dot photoluminescence display panel.

Figure 2A:
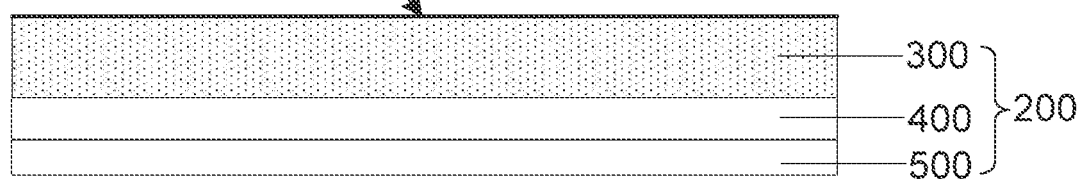
FIG. 2A is a sectional view of the display apparatus taken along the line AA' in FIG. 1.
Figure 10:
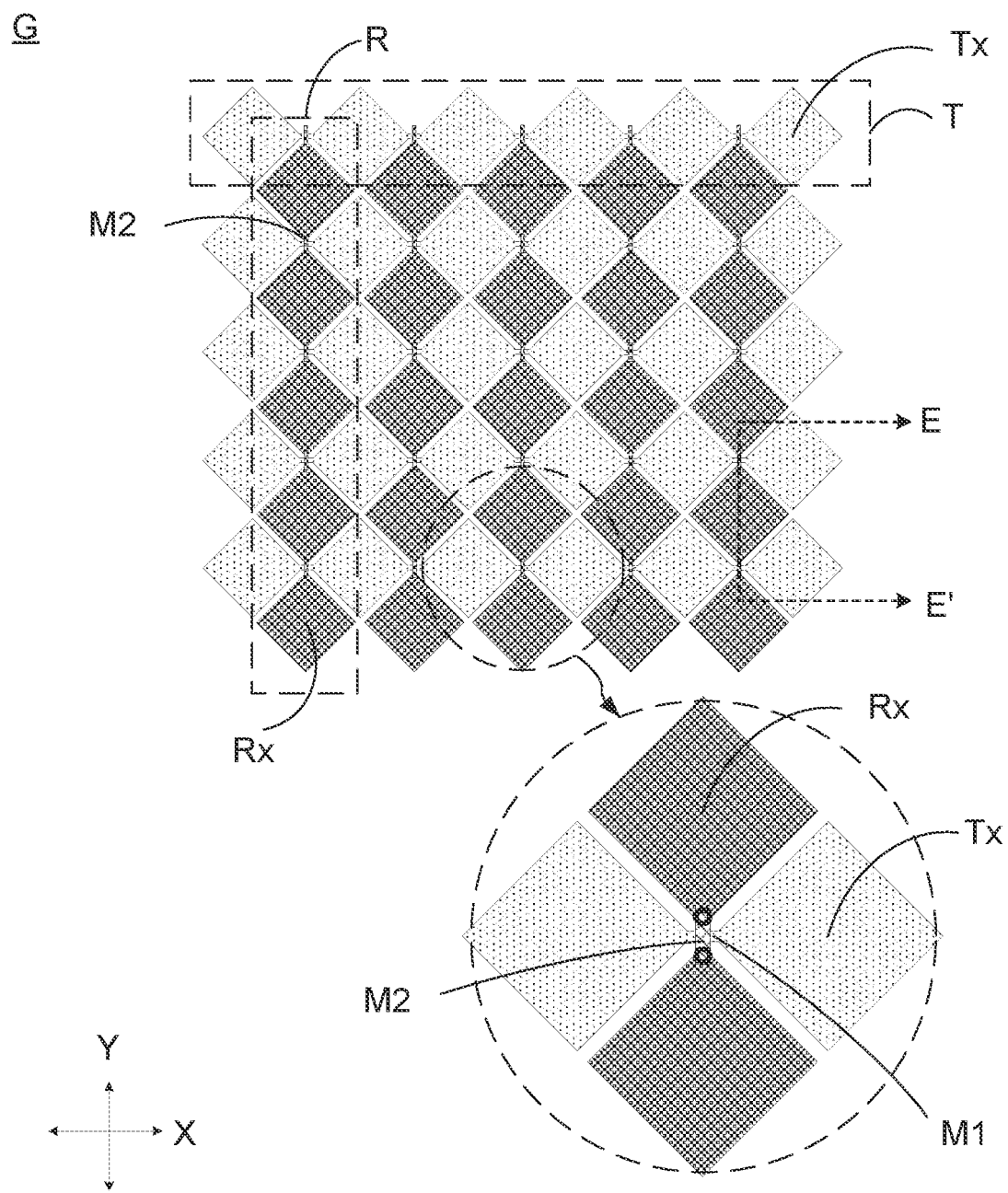
FIG. 10 is a diagram showing a structure of a region shown in the dotted box G in FIG. 4.
Figure 12:
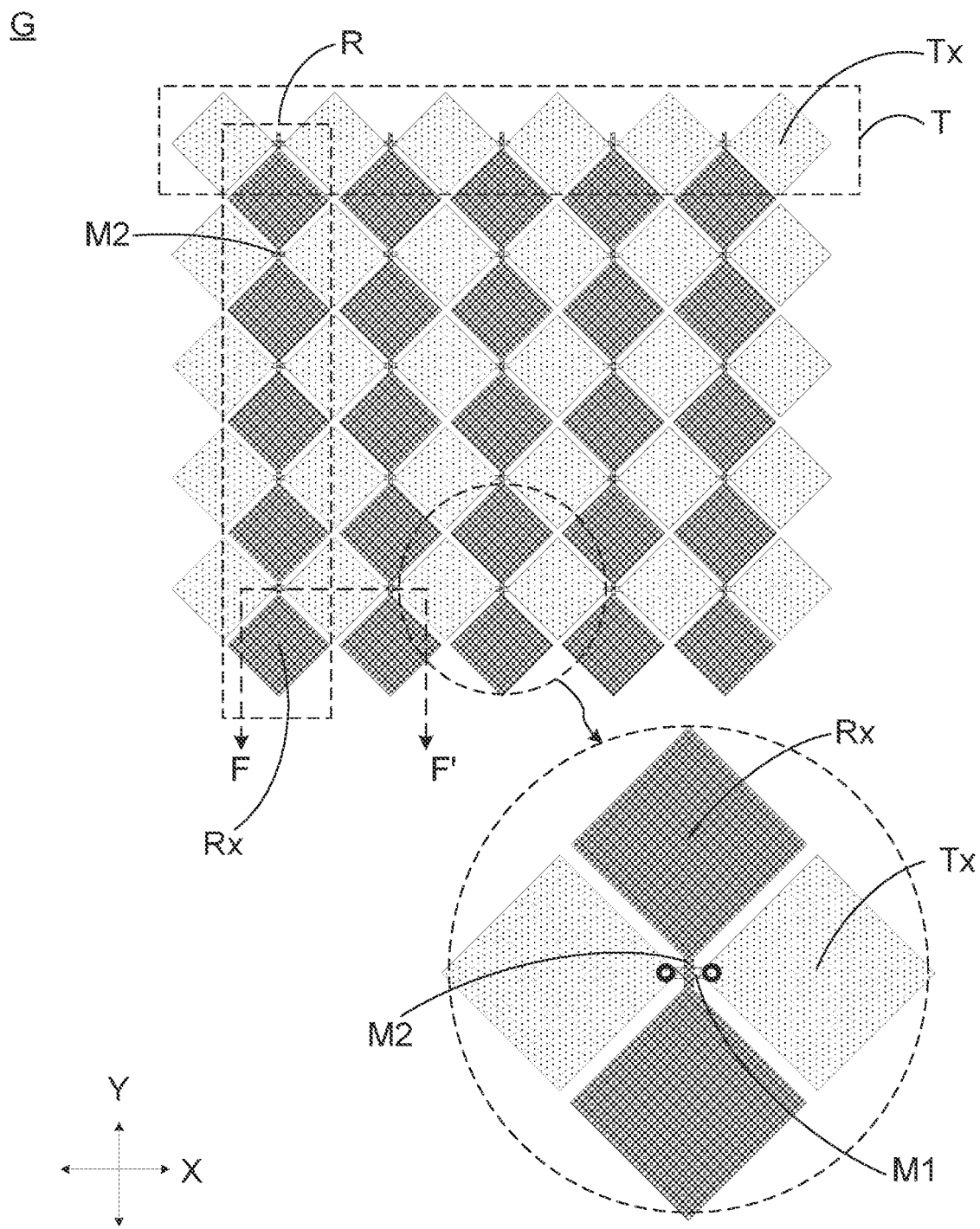
FIG. 12 is a diagram showing another structure of the region shown in the dotted box G in FIG. 4.

In some embodiments, the display panel 200 is an OLED display panel, as shown in FIG. 2A, the display panel 200 has a light exit surface 201 and includes a display substrate 500, an encapsulation structure 400 for encapsulating the display substrate 500 and a touch structure 300 (as shown in FIGS. 10 and 12) that are stacked in a direction proximate to the light exit surface 201. That is, compared with the display substrate 500 and the encapsulation structure 400, the touch structure 300 is closer to the light exit surface 201.

Figure 2B:
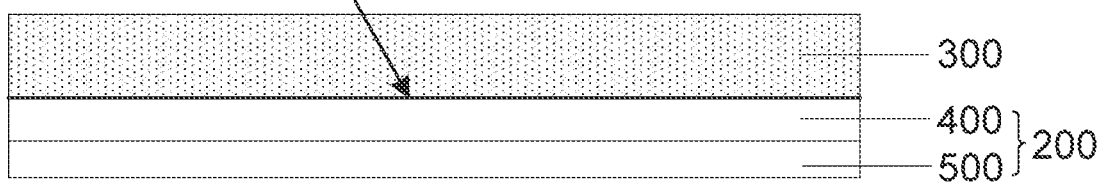
FIG. 2B is another sectional view of the display apparatus taken along the line AA' in FIG. 1.

In some other embodiments, as shown in FIG. 2B, the display panel 200 has a light exit surface 201 and includes a display substrate 500, an encapsulation structure 400 for encapsulating the display substrate 500 that are stacked in a direction proximate to the light exit surface 201. The display apparatus 100 further includes a touch structure 300, and the touch structure 300 is disposed on the light exit surface 201 of the display panel 200.

Herein, the encapsulation structure 400 may be an encapsulation film or an encapsulation substrate.

The touch structure 300 may be separately manufactured on a substrate and then disposed on the encapsulation structure 400. Or, The touch structure 300 may also be manufactured directly on the encapsulation structure 400, in this case, since the touch structure 300 is generally a flexible metal layer, a structure composed of the display substrate 500 and the encapsulation structure 400 is generally called "cell", this touch technology is called a flexible multi-layer on cell (FMLOC) technology. The FMLOC technology may be used to manufacture a light and thin touch structure 300, and applied to the manufacture of a foldable and rollable OLED display apparatus.

Figure 3:
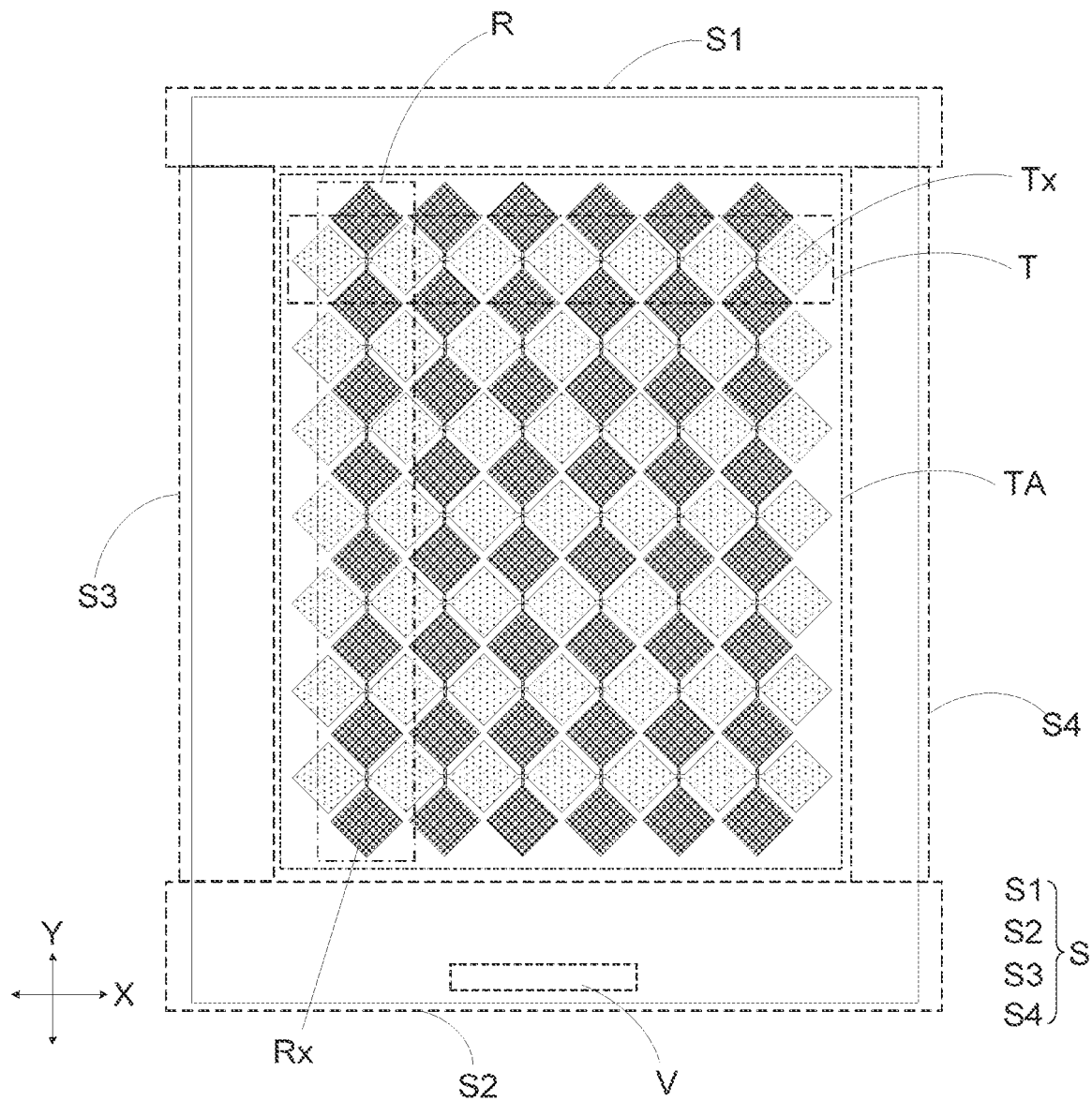
FIG. 3 is a top view of a touch structure, in accordance with some embodiments.

As shown in FIG. 3, the touch structure 300 has a touch area TA and a peripheral area S around the touch area TA.

The touch area TA is provided with a plurality of first touch units T extending in a first direction X and a plurality of second touch units R extending in a second direction Y. The plurality of first touch units T are arranged in parallel in the second direction Y, the plurality of second touch units R are arranged in parallel in the first direction X. The plurality of first touch units T are electrically insulated from the plurality of second touch units R.

The first touch units T are, for example, Tx channels, and the second touch units R are, for example, Rx channels; or, the first touch units T are, for example, Rx channels, and the second touch units R are, for example, Tx channels. The embodiments of the present disclosure are described only by taking an example in which the first touch units T are Tx channels and the second touch units R are Rx channels.

Each first touch unit T includes a plurality of first touch electrodes Tx and a plurality of first connection portions M1, and any two adjacent first touch electrodes Tx are electrically connected through one first connection portion M1. Each second touch unit R includes a plurality of second touch electrodes Rx and a plurality of second connection portions M2, and any two adjacent second touch electrodes Rx are electrically connected through one second connection portion M2.

In some examples, as shown in FIG. 3, the first touch electrode Tx and the second touch electrodes adjacent thereto are insulated and can generate a mutual capacitance. A value of the mutual capacitance changes after a touch point generated in the touch area TA, so that a change amount of the mutual capacitance value may be determined by detecting the mutual capacitance value, and in turn a touch position may be determined.

The first direction X intersects with the second direction Y. For example, the first direction X and the second direction Y may be perpendicular to each other. For another example, the first direction X may be a row direction in which pixels in the display apparatus 100 are arranged, and the second direction Y may be a column direction in which the pixels in the display apparatus 100 are arranged.

It will be noted that, figures of the embodiments of the present disclosure are illustrated by only taking an example in which the first direction X is the row direction and the second direction Y is the column direction. Technical solutions obtained by rotating the figures by 90 degrees or mirroring are also within the protection scope of the present disclosure.

In some examples, the first touch electrode Tx and the second touch electrode Rx may be both substantially in a shape of a rhombus. The term "substantially in a shape of a rhombus" means that the first touch electrode Tx and the second touch electrode Rx are both in a shape of a rhombus as a whole, and are not limited to a standard rhombus, for example, the first touch electrode Tx and second touch electrode Rx are both in a shape of a rhombus as a whole, but boundaries thereof are allowed to be non-linear (e.g., zigzag).

Shapes of the first touch electrode Tx and the second touch electrode Rx are not limited to a substantial rhombus. For example, shapes of the first touch electrode Tx and the second touch electrode Rx may also be a rectangle or a strip.

In some examples, the touch units (including the first touch electrodes Tx, the second touch electrodes Rx, the first connection portions M1 and the second connection portions M2) in the touch structure 300 employ a metal mesh structure. Compared with planar electrodes form by indium tin oxide (ITO) as touch electrodes (or connection portions), touch electrodes or connection portions with the metal mesh structure have low resistance and high sensitivity, so that a touch sensitivity of the touch structure 300 may be improved. Moreover, the touch electrodes or connection portions with the metal mesh structure have high mechanical strength, so that a weight of the touch structure 300 may be reduced. Therefore, the display apparatus 100 may be made light and thin when the touch structure 300 is applied to the display apparatus 100.

It can be understood that, the metal mesh structure refers to a structure composed of a plurality of metal filaments crossing each other, and an overall shape of the structure may be a rhombus, a rectangle, a strip, etc.

As shown in FIG. 3, the peripheral area S of the touch structure 300 includes a first peripheral sub-area S1 and a second peripheral sub-area S2 opposite to each other, and a third peripheral sub-area S3. Since the display apparatus 100 generally has a narrow bezel, each sub-area is in a shape of a strip. Both ends of the third peripheral sub-area S3 are respectively connected to the first peripheral sub-area S1 and the second peripheral sub-area S2.

As shown in FIG. 3, the touch structure 300 further includes a bonding region V located in the second peripheral sub-area S2.

In some example, lines applied to a touch structure in a display apparatus may be in the following wiring manner: for touch units with one type, e.g., Tx channels, two touch lines of each touch unit (e.g., Tx channel) are led out from both ends of the touch unit (e.g., upper and lower ends); and for touch units with the other type, e.g., Rx channels, one touch line of each touch unit (e.g., Rx channel) is led out from a single end of the touch unit (e.g., left or right end). Thus, this wiring manner may be called "2T1R", where the "T" represents the Tx channel, and "R" represents the Rx channel.

However, as the size of the display screen becomes larger and larger, the demand for touch signals increases, and the wiring manner above mentioned may no longer meet the touch demand. Therefore, in more display apparatus, the touch structure employs another wiring manner of "2T2R", that is, both of the Tx channel and the Rx channel are provided with two touch lines, for example, the touch lines for the Tx channel are led out from the upper and lower ends of the Tx channel, and the touch lines for the Rx channel are led out from the left and right ends of the Rx channel.

Figure 4:
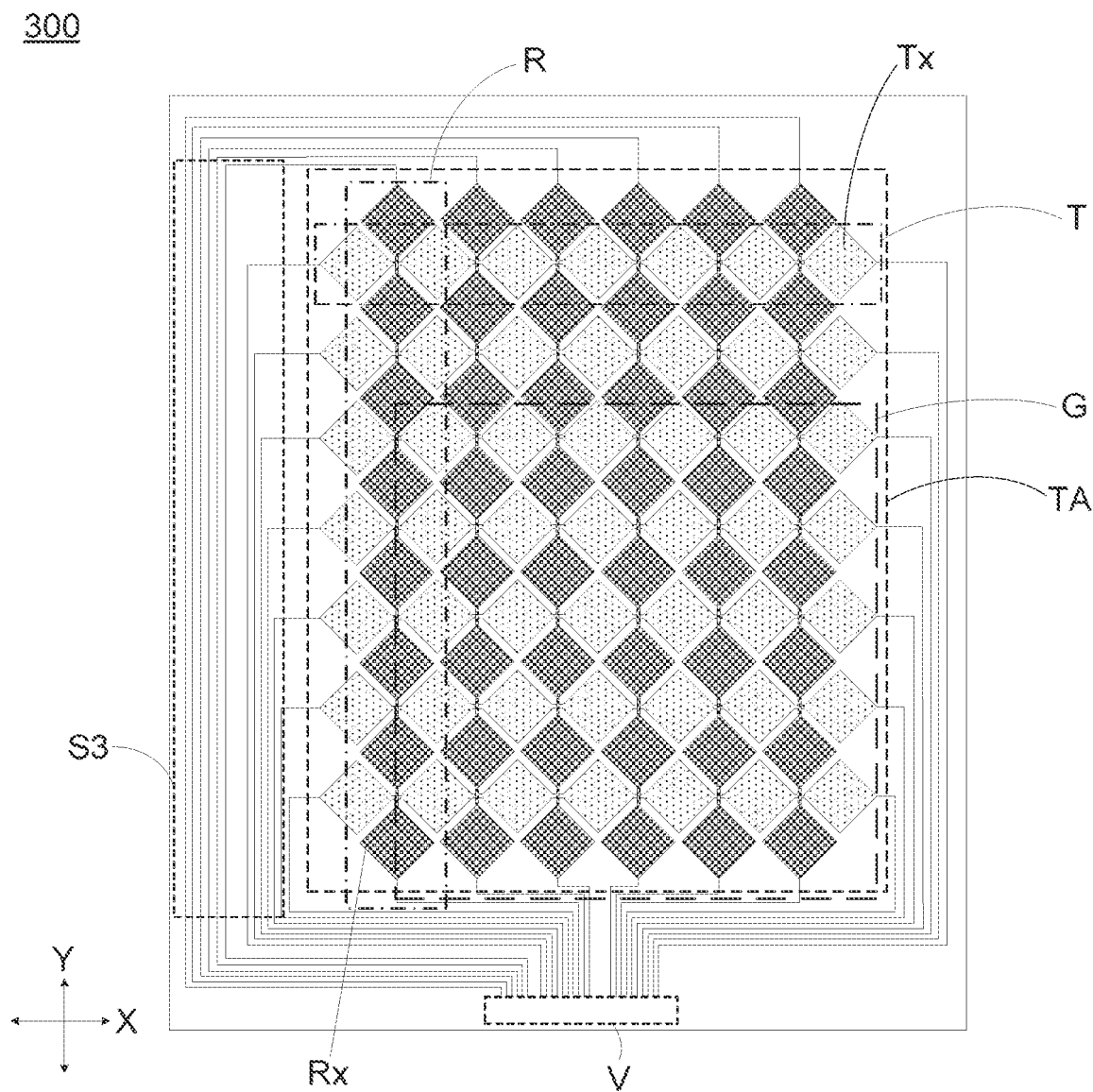
FIG. 4 is a top view of another touch structure, in accordance with some embodiments.

As shown in FIG. 4, in the technical solution of "2T2R", the touch lines for the Tx channels and the touch lines for the Rx channels are both at least partially disposed in the third peripheral sub-area S3, both of which have portions with a large length and close to (or parallel to) each other in the third peripheral sub-area S3, and signals on the portions with a large length and close to (or parallel to) each other are prone to crosstalk, resulting in a large parasitic capacitance, so that a value of the capacitance at some touch positions is greatly higher than a value of the capacitance at other positions, which affects the touch uniformity and sensitivity.

In addition, with the improvement of the touch accuracy, the number of touch signals increases, accordingly, the number of touch signal lines (i.e., the lines of the Tx channels and the Rx channels) increases, and a distance between portions of the touch signal lines located in the third peripheral sub-area S3 becomes smaller in a case where the size of the third peripheral sub-area S3 remains unchanged, so that the parasitic capacitance generated therebetween increases, and degree of crosstalk increases. If the distance between two touch signal lines increases, although the parasitic capacitance may be reduced to a certain extent, a dimension of the third peripheral sub-area S3 in the second direction Y increases accordingly, resulting in a large size of the bezel of the display apparatus 100.

Figure 5:
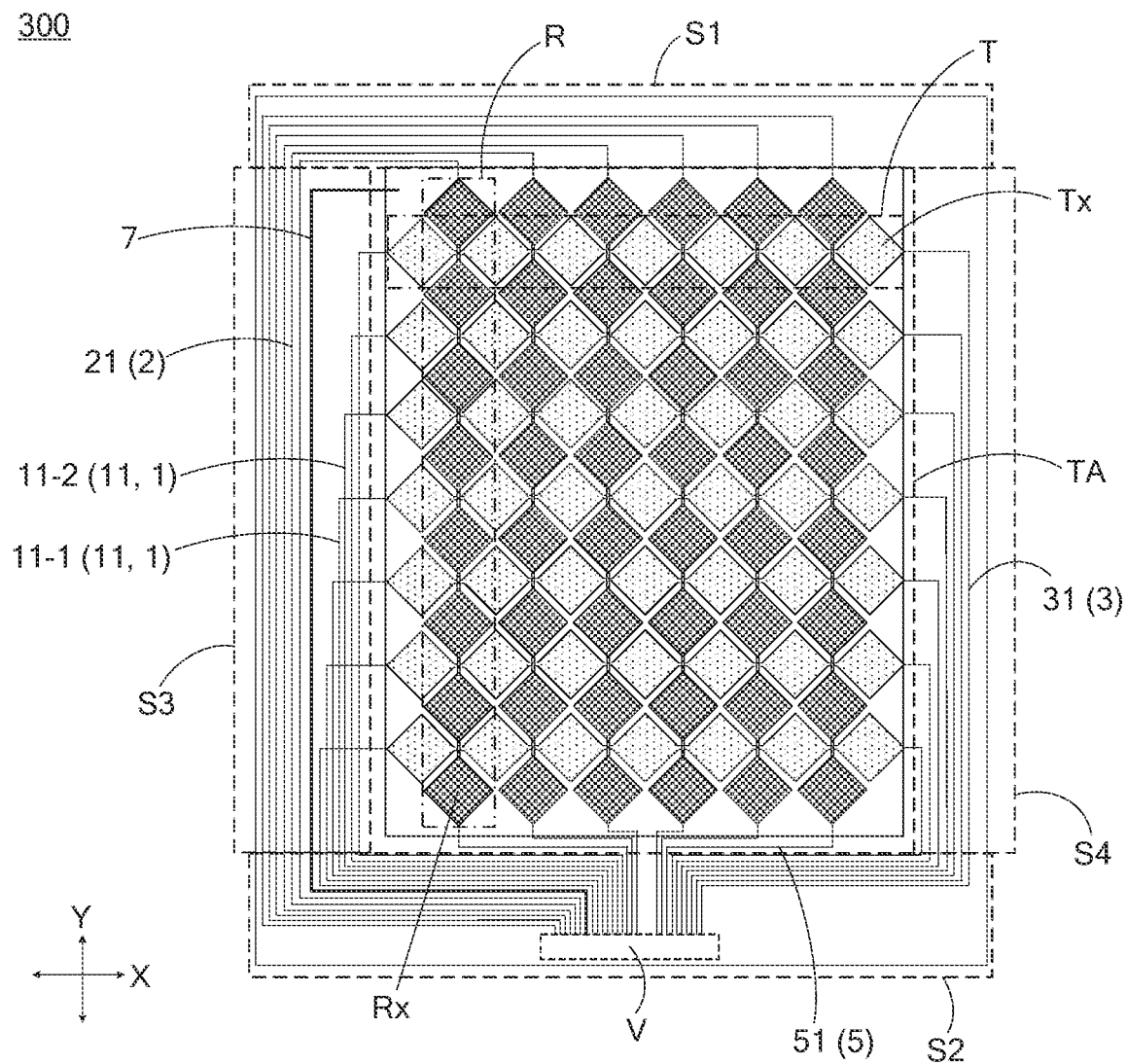
FIG. 5 is a top view of yet another touch structure, in accordance with some embodiments.
Figure 7:
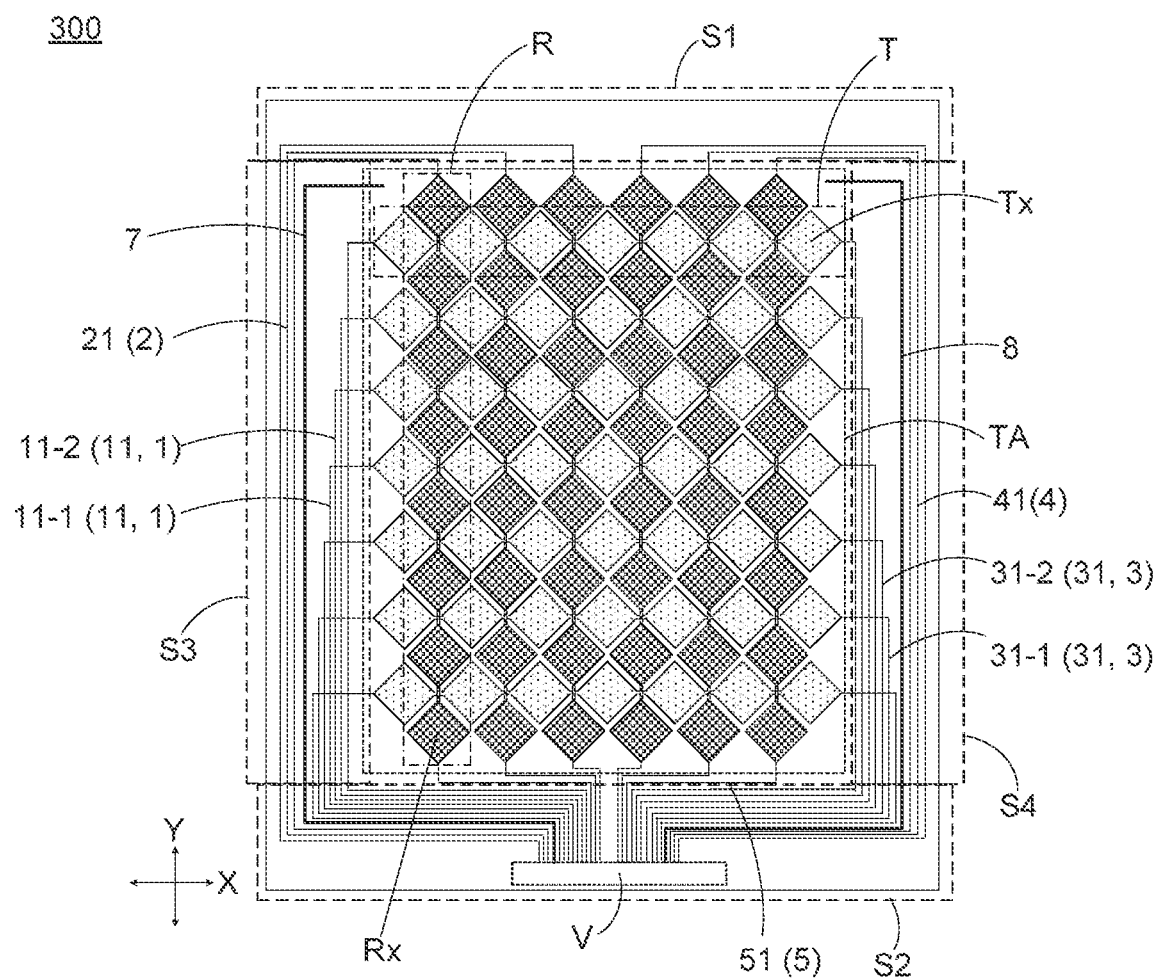
FIG. 7 is a top view of yet another touch structure, in accordance with some embodiments.
Figure 9:
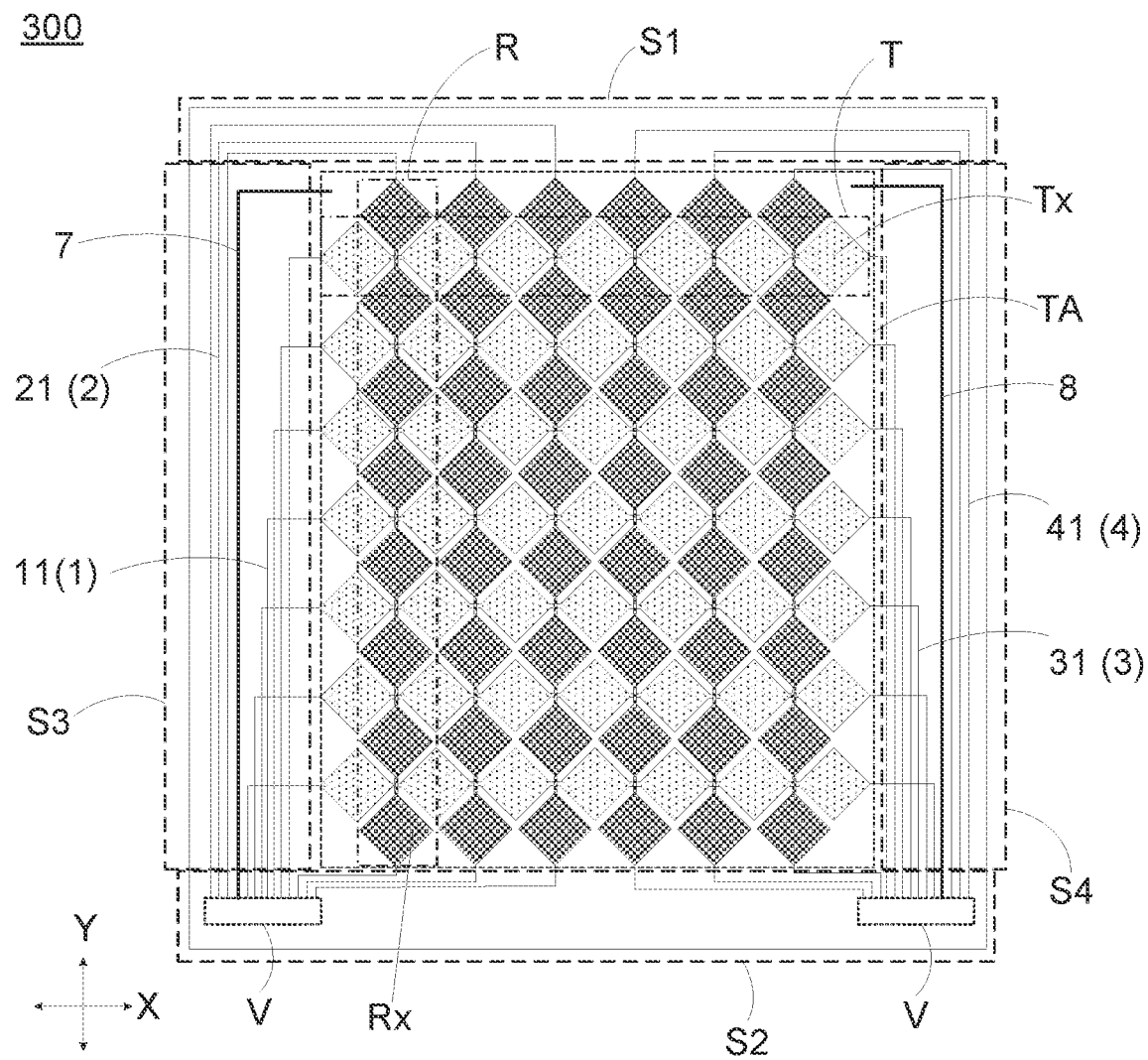
FIG. 9 is a top view of yet another touch structure, in accordance with some embodiments.

Based on this, some embodiments of the present disclosure provide a new wiring manner. As shown in FIGS. 5, 7 and 9, the touch structure 300 has a touch area TA and a peripheral area S around the touch area TA. The peripheral area S includes a first peripheral sub-area S1 and a second peripheral sub-area S2 opposite to each other, and a third peripheral sub-area S3. Each sub-area is in a shape of a strip. Both ends of the third peripheral sub-area S3 are respectively connected to the first peripheral sub-area S1 and the second peripheral sub-area S2. The touch area TA is provided with a plurality of first touch units T extending in a first direction X and a plurality of second touch units R extending in a second direction Y. The plurality of first touch units T are arranged in parallel in the second direction Y, the plurality of second touch units R are arranged in parallel in the first direction X. The plurality of first touch units T are electrically insulated from the plurality of second touch units R. The touch structure 300 further includes a first conductive line group 1 and a second conductive line group 2. The first conductive line group 1 includes a plurality of first conductive lines 11, and each first conductive line 11 is electrically connected to one first touch unit T. The second conductive line group 2 includes a plurality of second conductive line 21, and each second conductive line 21 is electrically connected to one second touch unit R.

The first conductive line group 1 and the second conductive line group 2 are both converged to the bonding region V after passing through the third peripheral sub-area S3, and are finally electrically connected to a touch processor (e.g., touch IC, not shown in the FIG. 5). The first conductive lines 11 are led out from the third peripheral sub-area S3 and extend to the bonding region V along the third peripheral sub-area S3. The second conductive lines 21 are led out from the first peripheral sub-area S1, pass through the third peripheral sub-area S3 and extend to the bonding region V. That is, the second conductive lines 21 extend to the bonding region V in respective extension direction of the first peripheral sub-area S1 and the third peripheral sub-area S3 in sequence. The second conductive line group 2 is further away from the touch area TA than the first conductive line group 1, that is, part of the second conductive line group 2 located in the third peripheral sub-area S3 is further away from the touch area TA than part of the first conductive line group 1 located in the third peripheral sub-area S3.

As shown in FIG. 5, at least one first conductive line 11 is further away from the touch area TA in the first direction X than another first conductive line 11, and a lead-out position of the at least one first conductive line 11 is closer to the second peripheral sub-area S2 than a lead-out position of the another first conductive line 11. In this way, the first conductive line 11 having the lead-out position closer to the second peripheral sub-area S2 extends a shorter length in the third peripheral sub-area S3 than the another first conductive line 11. It will be noted that, the term "lead-out position" refers to a position where one first conductive line 11 is connected to the corresponding touch unit.

Although the first conductive line 11 having the lead-out position closer to the second peripheral sub-area S2 is closer to the second conductive line group 2, since the first conductive line 11 having the lead-out position closer to the second peripheral sub-area S2 extends a shorter length in the third peripheral sub-area S3, a parallel length of the first conductive line 11 and the second conductive line group 2 is relatively small, a parasitic capacitance generated is correspondingly small, and the crosstalk is relatively small.

Moreover, although the first conductive line 11 having the lead-out position further away from the second peripheral sub-area S2 extends a longer length in the third peripheral sub-area S3, since the first conductive line 11 is closer to the touch area TA, i.e., further away from the second conductive line group 2, the crosstalk is not generated between this first conductive line 11 and the second conductive line group 2; or, even if the crosstalk is generated between this first conductive line 11 and the second conductive line group 2, the crosstalk is very small and may be negligible.

It may be known that, the solution provided by the embodiments of the present disclosure may reduce the crosstalk between adjacent touch conductive lines (e.g., the first conductive line 11 and the second conductive line 21 located in the third peripheral sub-area S3 and adjacent to each other) without increasing the dimension of the third peripheral sub-area S3 in the first direction X.

In some examples, in a case where the first conductive line group 1 includes two first conductive lines 11, one of the two first conductive lines 11 is further away from the touch area TA than the other of the two first conductive lines 11 in the first direction X, and the lead-out position of the one first conductive line 11 is closer to the second peripheral sub-area S2 than the lead-out position of the other first conductive line 11.

In some other examples, in a case where the first conductive line group 1 includes more than two first conductive lines 11, at least two first conductive lines 11 are further away from the touch area TA than another first conductive line 11 in the first direction X, and lead-out positons of the two first conductive lines 11 are closer to the second peripheral sub-area S2 than the lead-out position of the another first conductive line 11. For example, distances between the at least two first conductive lines 11 and the touch area TA may be the same or different, and distances between the lead-out positions of the at least two first conductive lines 11 and the second peripheral sub-area S2 may be the same or different.

In some other examples, as shown in FIG. 5, in the case where the first conductive line group 1 includes more than two first conductive lines 11, in any two first conductive lines 11, for example, the first conductive lines 11-1 and 11-2. The lead-out position of the first conductive line 11-1 is closer to the second peripheral sub-area S2 than the lead-out position of the first conductive line 11-2, and the first conductive line 11-1 is further away from the touch area TA in the first direction X than the first conductive line 11-2. That is, the first conductive line 11-1 having the lead-out position closer to the second peripheral sub-area S2 is closer to the second conductive line group 2 in the first direction X. In this way, a distance between the first conductive line 11-2 having the lead-out position further away from the second peripheral sub-area S2 and the second conductive line group 2 in the first direction X is larger than a distance between the first conductive line 11-1 and the second conductive line group 2 in the first direction X.

Although the first conductive line 11-2 having the lead-out position further away from the second peripheral sub-area S2 extends a longer length in the third peripheral sub-area S3 than the first conductive line 11-1, that is, a parallel length between the first conductive line 11-2 and the second conductive line group 2 is relatively long, since the distance between the first conductive line 11-2 and the second conductive line group 2 in the first direction X is large, a parasitic capacitance generated between the first conductive line 11-2 and the second conductive line group 2 is accordingly small, and the crosstalk is relatively small.

Moreover, although the distance between the first conductive line 11-1 having the lead-out position closer to the second peripheral sub-area S2 and the second conductive line group 2 in the first direction X is small, since the first conductive line 11-1 extends a shorter length in the third peripheral sub-area S3, that is, the parallel length between the first conductive line 11-1 and the second conductive line group 2 is relatively short, the crosstalk is not generated between the first conductive line 11-1 and the second conductive line group 2, or, even if the crosstalk is generated between the first conductive line 11-1 and the second conductive line group 2, the crosstalk is very small and may be negligible.

It may be known that, the solution provided by the embodiments of the present disclosure may reduce the crosstalk between adjacent touch conductive lines (e.g., the first conductive line 11 and the second conductive line 21 located in the third peripheral sub-area S3 and adjacent to each other) without increasing the dimension of the third peripheral sub-area S3 in the first direction X.

Figure 6:
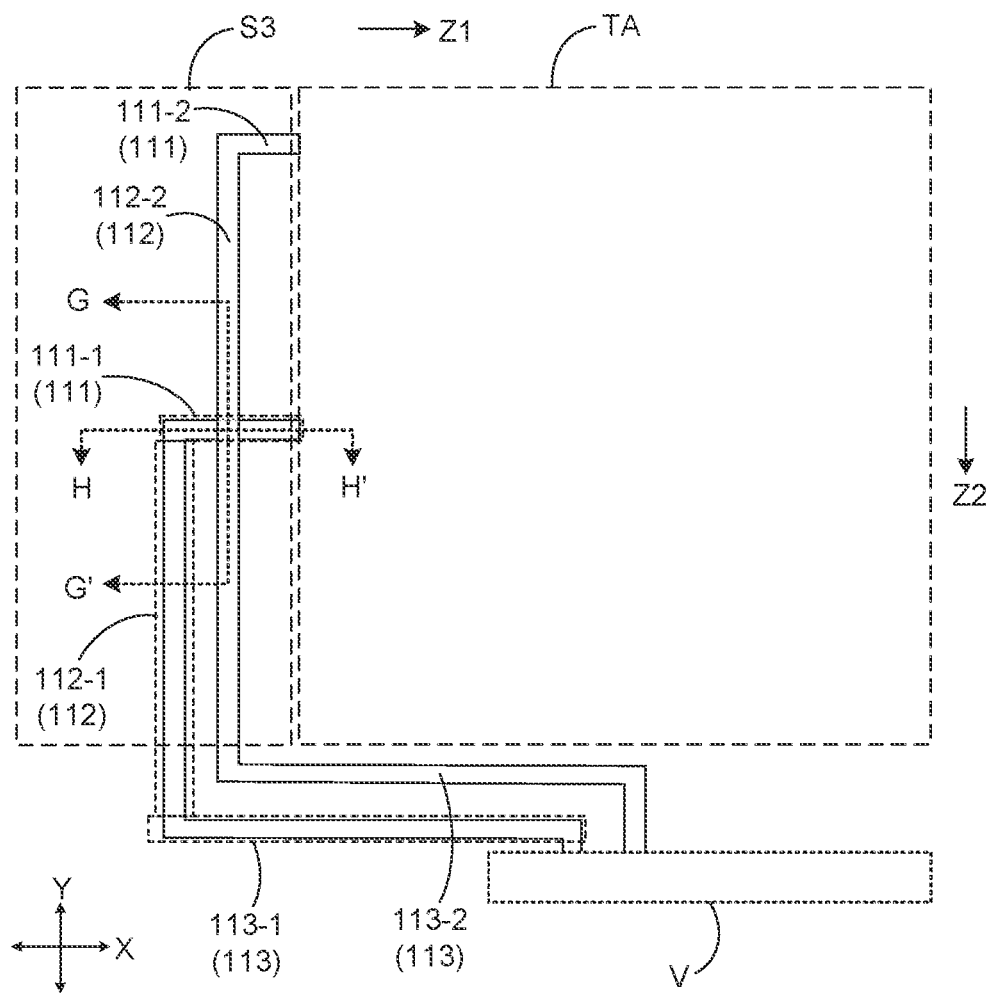
FIG. 6 is an partial enlarged view of a first conductive line group in FIG. 5.

In some embodiments, as shown in FIG. 6, the first conductive line 11 includes a first lead-out section 111, a first extension section 112 and a first connection section 113 that are connected in sequence. An end of the first lead-out section 111 away from the first extension section 112 is electrically connected to the first touch unit T, the first extension section 112 extends in the extension direction of the third peripheral sub-area S3, and the first connection section 113 extends from a region outside the bonding region V in the second peripheral sub-area S2 to the bonding region V. There is a parallel length between the first extension section 112 and the second conductive line group 2, which will generate the parasitic capacitance.

Furthermore, in some exemplary embodiments, as shown in FIG. 6, in any two first conductive lines 11-1 and 11-2 of the first conductive line group 1, the lead-out position of the first conductive line 11-1 is closer to the second peripheral sub-area S2 than the lead-out position of the first conductive line 11-2, and the first extension section 112-1 of the first conductive line 11-1 is relatively away from the touch area TA in the first direction X. Lengths of the first extension sections 112 of the plurality of first conductive lines 11 gradually increase in a direction Z1 from the third peripheral sub-area S3 to the touch area TA. In this way, the first extension section 112-1 of the first conductive line 11-1 having the lead-out position closer to the second peripheral sub-area S2 extends a shorter length in the third peripheral sub-area S3 than the first extension section 112-2 of the first conductive line 11-2, and a distance between the first extension section 112-2 of the first conductive line 11-2 having the lead-out position further away from the second peripheral sub-area S2 and the second conductive line group 2 is larger than a distance between the first extension section 112-1 of the first conductive line 11-1 and the second conductive line group 2.

Although the first extension section 112-1 of the first conductive line 11-1 having the lead-out position closer to the second peripheral sub-area S2 is closer to the second conductive line group 2 than the first extension section 112-2 of the first conductive line 11-2, since the first extension section 112-1 of the first conductive line 11-1 having the lead-out position closer to the second peripheral sub-area S2 extends a shorter length in the third peripheral sub-area S3, a parallel length between the first extension section 112-1 of the first conductive line 11-1 and the second conductive line group 2 is relatively small, the parasitic capacitance generated is accordingly small, and the crosstalk is relatively small. Moreover, although the first extension section 112-2 of the first conductive line 11-2 having the lead-out position further away from the second peripheral sub-area S2 extends a longer length in the third peripheral sub-area S3 than the first extension section 112-1 of the first conductive line 11-1, that is, a parallel length between the first extension section 112-2 of the first conductive lines 11-2 and the second conductive line group 2 is relatively large, since the distance between the first extension section 112-2 of the first conductive line 11-2 having the lead-out position further away from the second peripheral sub-area S2 and the second conductive line group 2 in the first direction X is large, a parasitic capacitance generated between the first extension section 112 and the second conductive line group 2 is accordingly small, and the crosstalk is relatively small.

It may be known that, the solution provided by the embodiments of the present disclosure may reduce the crosstalk between the first extension section 112 and the second conductive line group 2, and reduce an overall parasitic capacitance of the touch structure 300 by controlling the distance between the first extension section 112 and the second conductive line group 2 and the parallel length therebetween.

In some exemplary embodiments, as shown in FIG. 6, in any two first conductive lines 11-1 and 11-2 of the first conductive line group 1, the lead-out position of the first conductive line 11-1 is closer to the lead-out position of the first conductive line 11-2, the first extension section 112-1 of the first conductive line 11-1 is relatively far away from the touch area TA in the first direction X, and a length of the first lead-out section 111-1 of the first conductive line 11-1 is larger than a length of the first lead-out section 111-2 of the first conductive line 11-2. In this way, lengths of the first lead-out sections 111 of the plurality of first conductive lines 11 gradually increase in a direction Z2 from the first peripheral sub-area S1 to the second peripheral sub-area S2. As lengths of the first lead-out sections 111 gradually increase, the first extension sections 112 connected to the first lead-out sections 111 gradually approach the second conductive line group 2, and the first extension sections 112 of the first conductive lines 11 having the lead-out positions gradually approaching the second peripheral sub-area S2 gradually approach the second conductive line group 2, so that the distance between the second conductive line group 2 and the first conductive line 11 having a longer parallel length with the second conductive line group 2 increases, and the crosstalk is reduced.

In some embodiments, as shown in FIG. 6, in any two first conductive lines 11-1 and 11-2 of the first conductive line group 1, the lead-out position of the first conductive line 11-1 is closer to the second peripheral sub-area S2 than the lead-out position of the first conductive line 11-2, and the first connection section 113-1 of the first conductive line 11-1 is relatively far away from the touch area TA in the second direction Y, so that an orderly arrangement of the first connection sections 113 of the plurality of first conductive lines 11 is achieved, and cross-influence among the first connection sections 113 may be avoid.

In some embodiments, as shown in FIGS. 5, 7 and 9, a first isolation line 7 is provided between the adjacently arranged first conductive line group 1 and second conductive line group 2, and at least portion of the first isolation line 7 extends in the third peripheral sub-area S3. In some examples, the first isolation line 7 is connected to a line providing a constant potential, such as a power line, an initialization signal line, a ground line or a reference voltage line in the display apparatus 100. The first isolation line 7 has a signal shielding function, which may reduce the signal crosstalk between the adjacent first conductive line group 1 and the second conductive line group 2 to a certain extent.

In some embodiments, as shown in FIGS. 5, 7 and 9, the touch structure 300 further includes a third conductive line group 3. The third conductive line group 3 includes a plurality of third conductive lines 31, and each third conductive line 31 is electrically connected to one first touch unit T.

In some examples, as shown in FIG. 3, the peripheral area S further includes a fourth peripheral sub-area S4 opposite to the third peripheral sub-area S3, and both ends of the fourth peripheral sub-area S4 are respectively connected to the first peripheral sub-area S1 and the second peripheral sub-area S2.

In some exemplary embodiments, the third conductive line group 3 is converged to the bonding region V after passing through the fourth peripheral sub-area S4, and is finally electrically connected to the touch processor (e.g. the touch IC, not shown in the FIG. 5). The third conductive line 31 is led out from the fourth peripheral sub-area S4 and extends to the bonding region V.

In some embodiments, the plurality of third conductive lines 31 are electrically connected to all of the first touch units T. That is, each first touch unit T is connected to one first conductive line 11 and one third conductive line 31 respectively. By electrically connecting the first touch units T to two groups of conductive lines (i.e., the first conductive line group 1 and the third conductive line group 3), the transmission efficiency of touch signals is improved and the requirement of a large-size screen for the touch signals may be met.

In some embodiments, the plurality of third conductive line 31 are electrically connected to some of the first touch units T. For example, the first conductive lines 11 are electrically connected to the first touch units T in even-numbered rows, and the third conductive lines 31 are electrically connected to the first touch units T in odd-numbered rows.

In some embodiments, as shown in FIGS. 7 and 9, the touch structure 300 further includes a fourth conductive line group 4. The fourth conductive line group 4 includes at least one fourth conductive line 41. Each fourth conductive line 41 is electrically connected to one second touch unit R, and the fourth conductive line 41 is led out from the first peripheral sub-area S1, passes through the fourth peripheral sub-area S4 and extends to the bonding region V. That is, the fourth conductive line 41 extends to the bonding region V in respective extension direction of the first peripheral sub-area S1 and the fourth peripheral sub-area S4 in sequence. The fourth conductive line group 4 is further away from touch area TA than the third conductive line group 3, that is, part of the fourth conductive line group 4 located in the fourth peripheral sub-area S4 is further away from the touch area TA than part of the third conductive line group 3 located in the fourth peripheral sub-area S4.

In some embodiments, as shown in FIG. 7, each of some of the second touch units R is electrically connected to a respective one of all of the second conductive lines 21 of the second conductive line group 2, and each of some other of the second touch units R is electrically connected to a respective one of all of the fourth conductive lines 41 of the fourth conductive line group 4. That is, some of touch conductive lines (including the second conductive lines 21 and the fourth conductive lines 41) connected to the second touch units R, i.e., the second conductive line(s) 21, extend in the extension direction of the third peripheral sub-area S3, and the some other of touch conductive lines, i.e., the fourth conductive line(s) 41, extend in the extension direction of the fourth peripheral sub-area S4. In this case, parasitic capacitances are generated in the third peripheral sub-area S3 and the fourth peripheral sub-area S4.

In some examples, as shown in FIGS. 7 and 9, the number of the second conductive lines 21 are approximately the same as the number of the fourth conductive lines 41, so as to achieve uniform wiring on the left and right sides of the touch area TA. In some other examples, the number of the second conductive lines 21 may be different from the number of the fourth conductive lines 41, for example, there may be one second conductive line 21 and a plurality of the fourth conductive lines 41, or there may be one fourth conductive line 41 and a plurality of the second conductive lines 21.

In some embodiments, as shown in FIG. 7, at least one third conductive line 31 is further away from the touch area TA in the first direction X than another third conductive line 31, and a lead-out position of the at least one third conductive line 31 is closer to the second peripheral sub-area S2 than a lead-out position of the another third conductive line 31. In this way, the third conductive line 31 having the lead-out position closer to the second peripheral sub-area S2 extends a shorter length in the fourth peripheral sub-area S4 than the another third conductive line 31. It will be noted that, the term "lead-out position" refers to a position where one third conductive line 31 is connected to the respective touch unit.

Although the third conductive line 31 having the lead-out position closer to the second peripheral sub-area S2 is closer to the fourth conductive line group 4, since the third conductive line 31 having the lead-out position closer to the second peripheral sub-area S2 extends a shorter length in the fourth peripheral sub-area S4, a parallel length of this third conductive line 31 and the fourth conductive line group 4 is relatively small, the parasitic capacitance generated is accordingly small, and the crosstalk is relatively small.

Moreover, although the third conductive line 31 having the lead-out position further away from the second peripheral sub-area S2 extends a longer length in the fourth peripheral sub-area S4, since the third conductive line 31 is closer to the touch area TA, i.e., further away from the fourth conductive line group 4, the crosstalk is not generated between this third conductive line 31 and the fourth conductive line group 4, or, even if the crosstalk is generated between this third conductive line 31 and the fourth conductive line group 4, the crosstalk is very small and may be negligible.

It may be known that, the solution provided by the embodiments of the present disclosure may reduce the crosstalk between adjacent touch conductive lines (e.g., the third conductive line 31 and the fourth conductive line 41 located in the fourth peripheral sub-area S4 and adjacent to each other) without increasing a dimension of the fourth peripheral sub-area S4 in the first direction X.

In some examples, in a case where the third conductive line group 3 includes two third conductive lines 31, one of the two third conductive lines 31 is further away from the touch area TA than the other of the two third conductive lines 31 in the first direction X, and the lead-out position of the one third conductive line 31 is closer to the second peripheral sub-area S2 than the lead-out position of the other third conductive line 31.

In some other examples, in a case where the third conductive line group 3 includes more than two third conductive lines 31, at least two third conductive lines 31 are further away from the touch area TA than another third conductive line 31 in the first direction X, and lead-out positons of the two third conductive lines 31 are closer to the second peripheral sub-area S2 than the lead-out position of the another third conductive line 31. For example, distances between the at least two third conductive lines 31 and the touch area TA may be the same or different, and distances between the lead-out positions of the at least two third conductive lines 31 and the second peripheral sub-area S2 may be the same or different.

In some other examples, as shown in FIG. 7, in a case where the third conductive line group 3 includes more than two third conductive lines 31, in any two third conductive lines 31, for example, the third conductive lines 31-1 and 31-2, of the third conductive line group 3, the lead-out position of the third conductive line 31-1 is closer to the second peripheral sub-area S2 than the lead-out position of the third conductive line 31-2, and the third conductive line 31-1 is further away from the touch area TA in the first direction X than the third conductive line 31-2. That is, the third conductive line 31-1 having the lead-out position closer to the second peripheral sub-area S2 is closer to the fourth conductive line group 4 in the first direction X. In this way, a distance between the third conductive line 31-2 having the lead-out position further away from the second peripheral sub-area S2 and the fourth conductive line group 4 in the first direction X is larger than a distance between the third conductive line 31-1 and the fourth conductive line group 4 in the first direction X.

Although the third conductive line 31-2 having the lead-out position further away from the second peripheral sub-area S2 extends a longer length in the fourth peripheral sub-area S4 than the third conductive line 31-1, that is, the parallel length between the third conductive line 31-2 and the fourth conductive line group 4 is relatively long, since the distance between the third conductive line 31-2 and the fourth conductive line group 4 in the first direction X is large, the parasitic capacitance generated between the third conductive line 31 and the fourth conductive line group 4 is accordingly small, and the crosstalk is relatively small.

Moreover, although the distance between the third conductive line 31-1 having the lead-out position closer to the second peripheral sub-area S2 and the fourth conductive line group 4 in the first direction X is small, since the third conductive line 31-1 extends a shorter length in the fourth peripheral sub-area S4, that is, the parallel length between the third conductive line 31-1 and the fourth conductive line group 4 is relatively small, the crosstalk is not generated between the third conductive line 31-1 and the fourth conductive line group 4, or, even if the crosstalk is generated, the crosstalk is very small and may be negligible.

It may be known that, the solution provided by the embodiments of the present disclosure may reduce the crosstalk between adjacent touch conductive lines (e.g., the third conductive line 31 and the fourth conductive line 41 located in the fourth peripheral sub-area S4 and adjacent to each other) without increasing a dimension of the fourth peripheral sub-area S4 in the first direction X.

Figure 8:
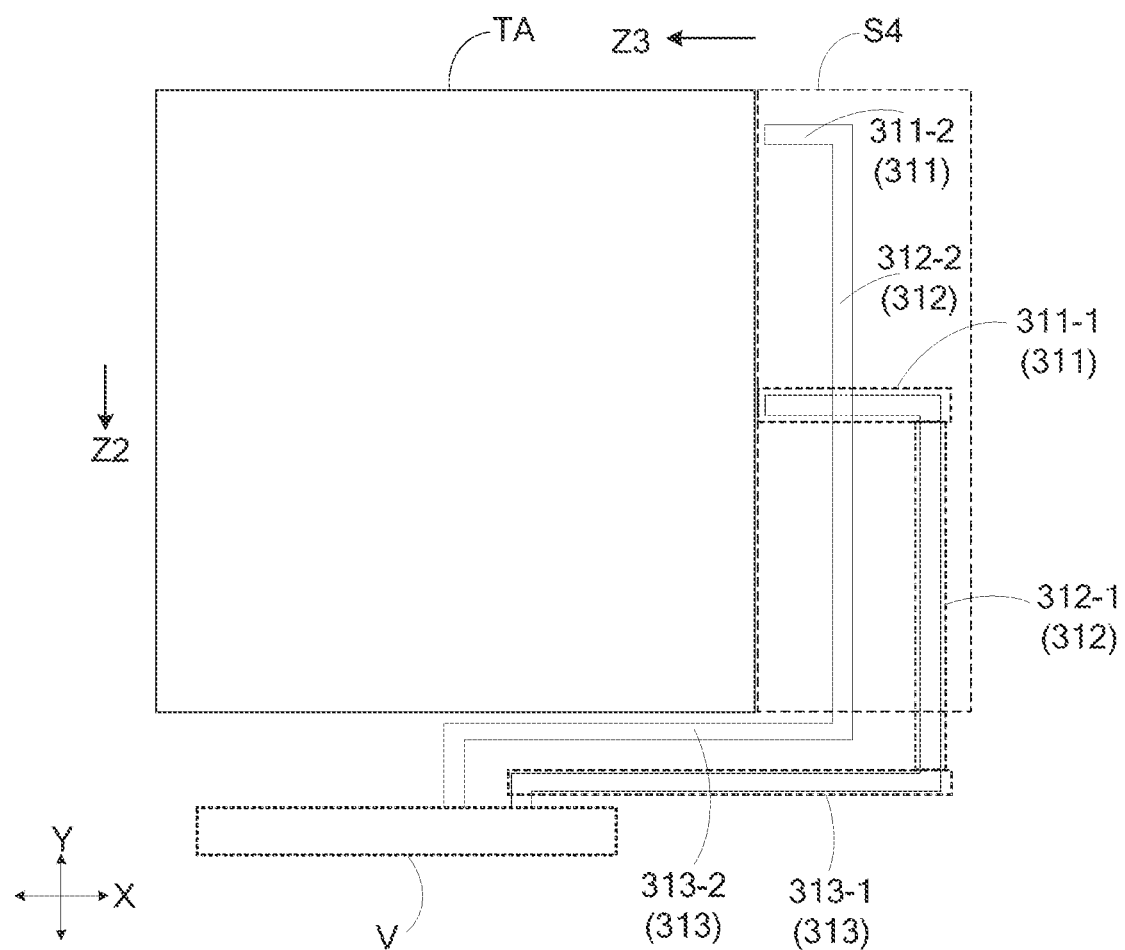
FIG. 8 is an partial enlarged view of a third conductive line group in FIG. 7.

In some embodiments, as shown in FIG. 8, the third conductive line 31 includes a second lead-out section 311, a second extension section 312, and a second connection section 313 that are connected in sequence. An end of the second lead-out section 311 away from the second extension section 312 is electrically connected to the first touch unit T, the second extension section 312 extends in the extension direction of the fourth peripheral sub-area S4, and the second connection section 313 extends from a region outside the bonding region V in the second peripheral sub-area S2 to the bonding region V. There is a parallel length between the second extension section 312 and the fourth conductive line group 4, which will generate the parasitic capacitance.

Furthermore, in some exemplary embodiments, in any two third conductive lines 31-1 and 31-2 of the third conductive line group 3, the lead-out position of the third conductive line 31-1 is closer to the second peripheral sub-area S2 than the lead-out position of the third conductive line 31-2, and the second extension section 312-1 of the third conductive line 31-1 is relatively far away from the touch area TA in the first direction X. Lengths of the second extension sections 312 of the plurality of third conductive lines 31 gradually increase in a direction Z3 from the fourth peripheral sub-area S4 to the touch area TA. In this way, the second extension section 312-1 of the third conductive line 31-1 having the lead-out position closer to the second peripheral sub-area S2 extends a shorter length in the fourth peripheral sub-area S4 than the second extension section 312-2 of the third conductive line 31-2, and a distance between the second extension section 312-2 of the third conductive line 31-2 having the lead-out position further away from the second peripheral sub-area S2 and the fourth conductive line group 4 is larger than a distance between the second extension section 312-1 of the third conductive line 31-1 and the fourth conductive line group 4.

Although the second extension section 312-1 of the third conductive line 31-1 having the lead-out position closer to the second peripheral sub-area S2 is closer to the fourth conductive line group 4 than the second extension section 312-2 of the third conductive line 31-2, since the second extension section 312-1 of the third conductive line 31-1 extends a shorter length in the fourth peripheral sub-area S4, a parallel length between the second extension section 312-1 of the third conductive line 31-1 and the fourth conductive line group 4 is relatively small, the parasitic capacitance generated is accordingly small, and the crosstalk is relatively small. Moreover, although the second extension section 312-2 of the third conductive line 31-2 having the lead-out position further away from the second peripheral sub-area S2 extends a longer length in the fourth peripheral sub-area S4 than the second extension section 312-1 of the third conductive line 31-1, that is, the parallel length between the second extension section 312-2 of the third conductive line 31-2 and the fourth conductive line group 4 is relatively large, since the distance between the second extension section 312-2 of the third conductive line 31-2 having the lead-out position further away from the second peripheral sub-area S2 and the fourth conductive line group 4 in the first direction X is large, the parasitic capacitance generated between the second extension section 312 and the fourth conductive line group 4 is correspondingly small, and the crosstalk is relatively small.

It may be known that, the solution provided by the embodiments of the present disclosure may reduce the crosstalk between the second extension section 312 and the fourth conductive line group 4, and may reduce an overall parasitic capacitance of the touch structure 300 by controlling the distance between the second extension section 312 and the fourth conductive line group 4 and the parallel length therebetween.

In some exemplary embodiments, as shown in FIG. 8, in any two third conductive lines 31-1 and 31-2 of the third conductive line group 3, the lead-out position of the third conductive line 31-1 is closer to the second peripheral sub-area S2 than the lead-out position of the third conductive line 31-2, the second extension section 312-1 of the third conductive line 31-1 is relatively far away from the touch area TA in the first direction X, and a length of the second lead-out section 311-1 of the third conductive line 31-1 is larger than a length of the second lead-out section 311-2 of the third conductive line 31-2. In this way, lengths of the second lead-out sections 311 of the plurality of third conductive lines 31 gradually increase in the direction Z2 from the first peripheral sub-area S1 to the second peripheral sub-area S2, and the second extension sections 312 connected to the second lead-out sections 311 gradually approach the fourth conductive line group S4, and the second extension sections 312 of the third conductive lines 31 having the lead-out positions gradually approaching the second peripheral sub-area S2 gradually approach the fourth conductive line group 4, so that the distance between the fourth conductive line group 4 and the third conductive line 31 having a longer parallel length with the fourth conductive line group 4 increases, and the crosstalk is reduced.

In some embodiments, as shown in FIG. 8, in any two third conductive lines 31-1 and 31-2 of the third conductive line group 3, the lead-out position of the third conductive line 31-1 is closer to the second peripheral sub-area S2 than the lead-out position of the third conductive line 31-2, and the second connection section 313-1 of the third conductive line 31-1 is relatively far away from the touch area TA in the second direction Y, so that an orderly arrangement of the second connection sections 313 of the plurality of third conductive lines 31 is achieved, and cross-influence among the second connection sections 313 may be avoid.

In some embodiments, as shown in FIGS. 7 and 9, the touch structure 300 further includes a second isolation line 8 arranged between the third conductive line group 3 and the fourth conductive line group 4. At least portion of the second isolation line 8 extends in the fourth peripheral sub-area S4. In some examples, the second isolation line 8 is connected to a line providing a constant potential, such as a power line, an initialization signal line, a ground line or a reference voltage line in the display apparatus 100. The second isolation line 8 has a signal shielding function, which may reduce the signal crosstalk between the adjacent third conductive line group 3 and the fourth conductive line group 4 to a certain extent.

In some embodiments, each of all of the second touch units R is electrically connected to a respective one of all of the second conductive lines 21 of the second conductive line group 2. That is, all touch conductive lines (the second conductive lines 21) connected to the second touch units R extend in the third peripheral sub-area S3. In this case, the parasitic capacitance is generated only in the third peripheral sub-area S3.

In some embodiments, as shown in FIGS. 5 and 7, the touch structure 300 further includes a fifth conductive line group 5. The fifth conductive line group 5 includes a plurality of fifth conductive line 51. Each fifth conductive line 51 is connected to an end of one second touch unit R proximate to the second peripheral sub-area S2, and the fifth conductive line 51 is led out from the second peripheral sub-area S2 and extends to the bonding region V. That is, an end of each second touch unit R is electrically connected to the second conductive line 21 or the fourth conductive line 41, and the other end of the second touch unit R is electrically connected to the fifth conductive line 51, so that the transmission efficiency of touch signals is improved by electrically connecting each second touch unit R to two touch conductive lines, and the requirement of a large-size screen for the touch signals may be met.

In some examples, as shown in FIGS. 3 to 5 and 7, there is one bonding region V in the second peripheral sub-area S2. In some other examples, there are a plurality of bonding regions V in the second peripheral sub-area S2, for example, as shown in FIG. 9, there are two bonding regions V. For example, the first conductive line group 1, the second conductive line group 2 and the first isolation line 7 extend to one bonding region V, while the third conductive line group 3, the fourth conductive line group 4 and the second isolation line 8 extend to the other bonding region V. The embodiments of the present disclosure do not limit the number of the bonding regions V.

Since two different touch conductive lines transmit different touch signals, there is a need to enable the two touch conductive lines crossing each other to be insulated from each other.

In some embodiments, the touch structure 300 includes a first conductive layer, an insulating layer and a second conductive layer that are stacked. For example, an orthogonal projection of the first conductive layer on the display substrate 500 may be in a shape of a grid, and the first conductive layer is made of metal, nanomaterials (e.g., graphene), ITO, indium zinc oxide (IZO) or the like. For example, an orthogonal projection of the second conductive layer on the display substrate 500 may be in a shape of a grid, and the second conductive layer is made of metal, nanomaterials (e.g., graphene), ITO, IZO or the like.

In some exemplary embodiments, as shown in FIG. 10, every two adjacent first touch electrodes Tx are electrically connected through one first connection portion M1 in the first direction X, and the first connection portion M1 and the first touch electrodes Tx are located in the same layer. Every two adjacent second touch electrodes Rx are bridged by one second connection portion M2 in the second direction Y, and the second connection portion M2 and the second touch electrodes Rx are located in different layers. In this case, the first touch electrodes Tx, the second touch electrodes Rx, and the first connection portions M1 are located in the same layer.

Figure 11:
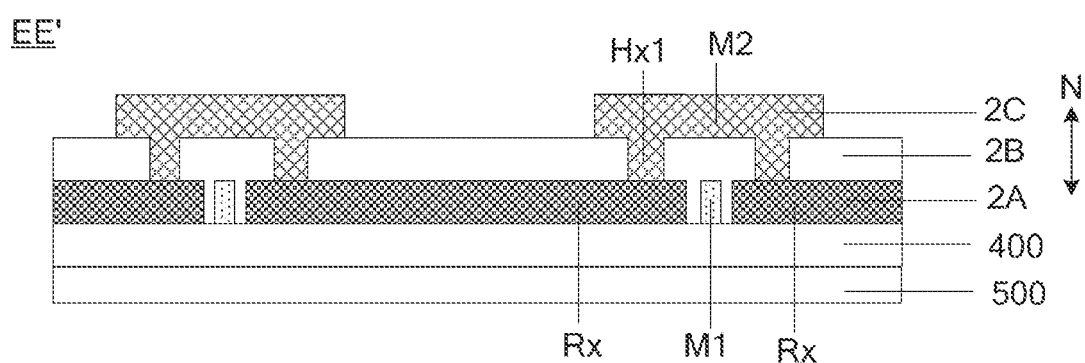
FIG. 11 is a sectional view of the touch structure taken along the line EE' in FIG. 10.

FIG. 11 shows a sectional structure of the touch structure 300 in FIG. 10 taken along the line EE'. The touch structure 300 includes a first conductive layer 2A, an insulating layer 2B and a second conductive layer 2C that are stacked in the thickness direction N of the touch structure 300. The first touch electrodes Tx, the second touch electrodes Rx and the first connection portions M1 are located in the first conductive layer 2A, the second connection portions M2 are located in the second conductive layer 2C, and the second conductive layer 2C is located on a side of the first conductive layer 2A away from the display substrate 500. The insulating layer 2B has a plurality of via holes Hx, and the second connection portion M2 is electrically connected to two adjacent second touch electrodes Rx through two via holes. In order to distinguish via holes corresponding to different elements in the embodiments of the present disclosure, via holes connecting the second connection portion M2 and the two adjacent second touch electrodes Rx are referred to as first via holes Hx1 herein.

In some exemplary embodiments, as shown in FIG. 12, every two adjacent second touch electrodes Rx are electrically connected through one second connection portion M2 in the second direction Y, and the second connection portion M2 and the second touch electrodes Tx are located in the same layer. Every two adjacent first touch electrodes Tx are bridged by one first connection portion M1 in the first direction X, and the first connection portion M1 and the first touch electrodes Tx are located in different layers. In this case, the first touch electrodes Tx, the second touch electrodes Rx and the second connection portions M1 are located in the same layer.

Figure 13:
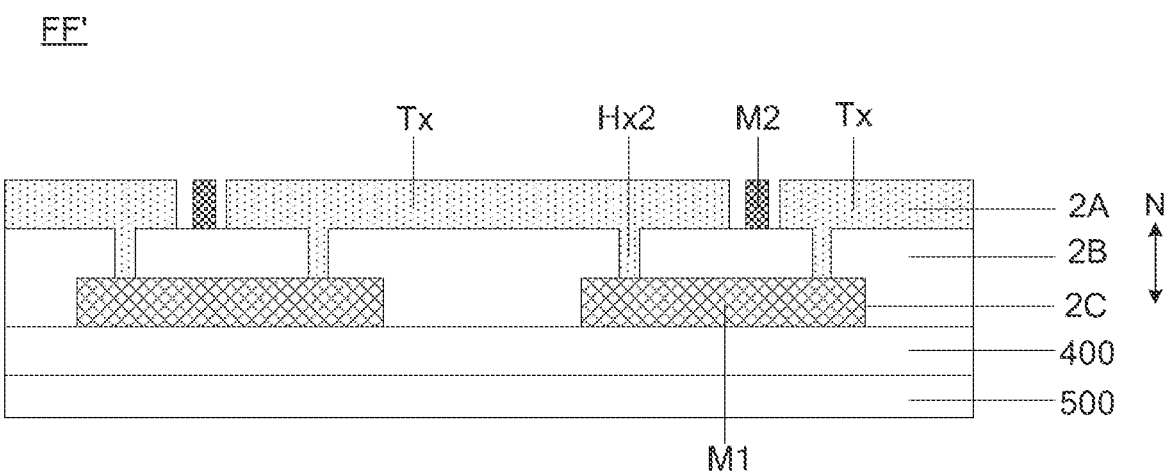
FIG. 13 is a sectional view of the touch structure taken along the line FF' in FIG. 12.

FIG. 13 shows a sectional structure of the touch structure 300 in FIG. 12 taken along the line FF'. The first touch electrodes Tx, the second touch electrodes Rx and the second connection portions M2 are located in the first conductive layer 2A, the first connection portions M1 are located in the second conductive layer 2C, and the second conductive layer 2C is located on a side of the first conductive layer 2A proximate to the display substrate 500. The insulating layer 2B has a plurality of via holes Hx, and the first connection portion M1 is electrically connected to two adjacent first touch electrodes Tx through two via holes. Herein, the via holes connecting the first connection portion M1 and the two adjacent first touch electrodes Tx are referred to as second via holes Hx2.

It will be noted that, the first conductive layer 2A and the second conductive layer 2C are stacked, for example, as shown in FIG. 11, the second conductive layer 2C is disposed on a side of the first conductive layer 2A away from the display substrate 500; or, as shown in FIG. 13, the first conductive layer 2A is disposed on a side of the second conductive layer 2C away from the display substrate 500.

In some embodiments, as shown in FIG. 6, in any two first conductive lines 11-1 and 11-2 of the first conductive line group 1, the first extension section 112-2 of the first conductive line 11-2 having the lead-out position further away from the second peripheral sub-area S2 crosses and is insulated from the first lead-out section 111-1 of the first conductive line 11-1.

In some examples, the first conductive line 11 has a double-layer structure. The first conductive line 11 includes a first conductive sub-line and a second conductive sub-line located in different layers in the thickness direction N of the touch structure 300 and electrically connected, for example, the first conductive sub-line located in the first conductive layer 2A, and the second conductive sub-line located in the second conductive layer 2C. An orthogonal projection of the first conductive sub-line on a reference plane overlaps with an orthogonal projection of the second conductive sub-line on the reference plane, and the first conductive sub-line is electrically connected to the second conductive sub-line through via holes in the insulating layer 2B. The reference plane is a plane where the touch structure 300 is located. For example, the reference plane is a light exit surface 201 of the display panel 200. Herein, the via holes connecting the first conductive sub-line and the second conductive sub-line are referred to as third via holes.

In some exemplary embodiments, one first conductive line 11 is arranged to cross another first conductive line 11. The first conductive sub-line of one of the two crossing first conductive lines 11 is provided with a first break at a crossing position, the second conductive sub-line of the other first conductive line 11 is provided with a second break at the crossing position. In this way, cross-wiring of the two first conductive lines 11 may be achieved on a basis that a thickness of the touch structure 300 does not increase, and each first conductive line 11 has a double-layer wiring structure in non-crossing regions, so that performance of signal transmission may be ensured.

Figure 14:
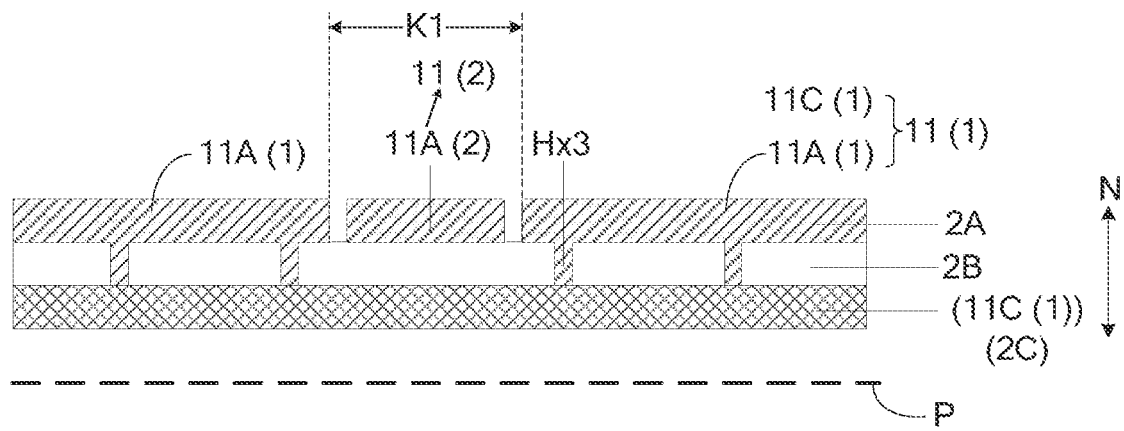
FIG. 14 is a sectional view of first conductive lines taken along the line GG' in FIG. 6.
Figure 15:
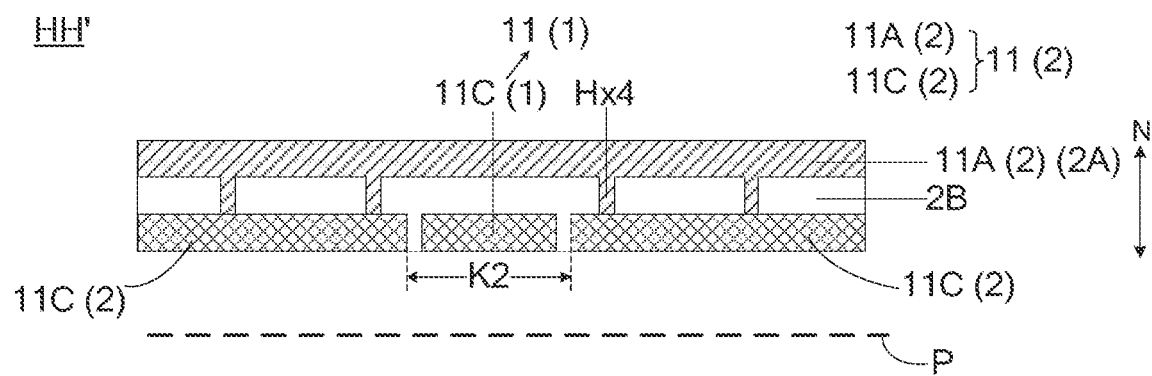
FIG. 15 is a sectional view of first conductive lines taken along the line HH' in FIG. 6.

For example, as shown in FIGS. 14 and 15, in the two first conductive lines 11(1) and 11(2) crossing each other, the first conductive line 11(1) includes a first conductive sub-line 11A(1) located in the first conductive layer 2A and a second conductive sub-line 11C(1) located in the second conductive layer 2C, that is, the first conductive sub-line 11A(1) and the second conductive sub-line 11C(1) are located in different layers in the thickness direction N of the touch structure 300. An orthogonal projection of the first conductive sub-line 11A(1) on a reference plane P overlaps with an orthogonal projection of the second conductive sub-line 11C(1) on the reference plane P, and the first conductive sub-line 11A(1) is electrically connected to the second conductive sub-line 11C(1) through the via holes Hx3 in the insulating layer 2B. The first conductive line 11(2) includes a first conductive sub-line 11A(2) located in the first conductive layer 2A and a second conductive sub-line 11C(2) located in the second conductive layer 2C, that is, the first conductive sub-line 11A(2) and the second conductive sub-line 11C(2) are located in different layers in the thickness direction N of the touch structure 300. An orthogonal projection of the first conductive sub-line 11A(2) on the reference plane P overlaps with an orthogonal projection of the second conductive sub-line 11C(2) on the reference plane P, and the first conductive sub-line 11A(2) is electrically connected to the second conductive sub-line 11C(2) through the via holes Hx4 in the insulating layer 2B. The first conductive sub-line 11A(1) of the first conductive line 11(1) is provided with a first break K1, and the first conductive sub-line 11A(2) of the first conductive line 11(2) passes through the first break K1. Accordingly, the second conductive sub-line 11C(2) of the other first conductive line 11(2) is provided with a second break K2, and the second conductive sub-line 11C(1) of the first conductive line 11(1) passes through the second break K2. In this way, a crossing position where the first conductive line 11(1) and the first conductive line 11(2) crossing each other is still flat, thereby avoiding changes in thickness.

In some other embodiments, the first conductive line 11 has a single-layer structure. For example, a plurality of first conductive lines 11 are disposed in one of the first conductive layer 2A and the second conductive layer 2C.

In some exemplary embodiments, one first conductive line 11 is arranged to cross another first conductive line 11. One of the two crossing first conductive lines 11 is disconnected at the crossing position, and the two disconnected portions are electrically connected through one bridge portion. An insulating portion is provided between the bridge portion and the other of the two first conductive lines 11 crossing each other. The bridge portion is provided in the other of the first conductive layer 2A and the second conductive layer 2C, and a portion of the insulating layer 2B located at the crossing position serves as the insulating portion.

Figure 16:
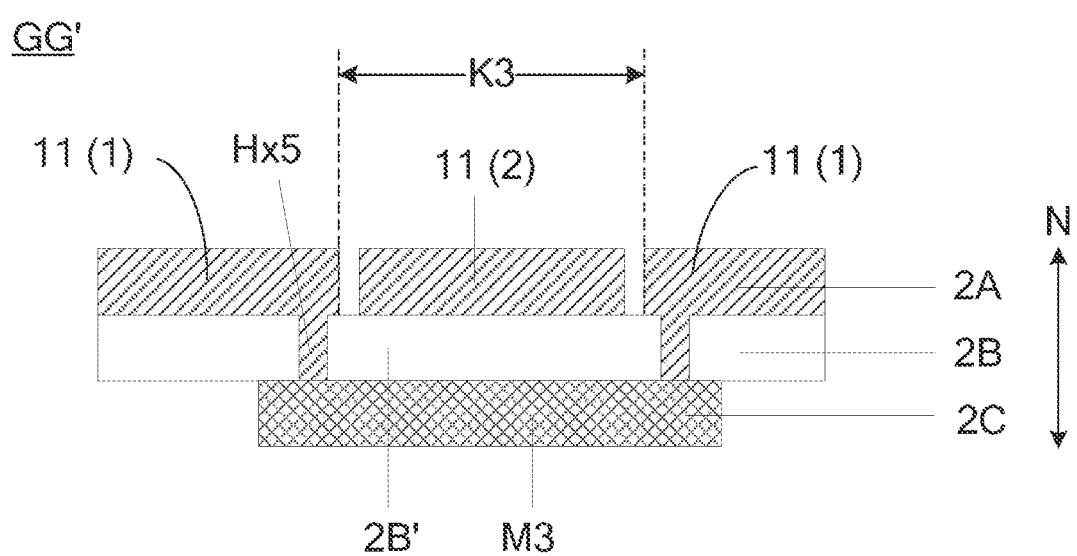
FIG. 16 is another sectional view of the first conductive lines taken along the line GG' in FIG. 6.

For example, as shown in FIG. 16, in the two first conductive lines 11(1) and 11(2) crossing each other, the two first conductive lines 11(1) and 11(2) are both disposed in the first conductive layer 2A. The first conductive line 11(1) is disconnected to form a third break K3 at the crossing position, and the first conductive line 11(2) passes through the third break K3. The two disconnected portions of the first conductive line 11(1) are electrically connected through one bridged portion M3, and the bridge portion M3 is disposed in the second conductive layer 2C. A portion of the insulating layer 2B opposite to the bridge portion M3 serves as an insulating portion 2B', so as to insulate the two first conductive lines 11 crossing each other.

In some embodiments, as shown in FIG. 8, in any two third conductive lines 31-1 and 31-2 of the third conductive line group 3, the second extension section 312-2 of the third conductive line 31-2 having the lead-out position further away from the second peripheral sub-area S2 crosses and is insulated from the second lead-out section 311-1 of the third conductive line 31-1.

Similarly, in some embodiments, the third conductive line 31 has a double-layer structure. For example, the third conductive line 31 includes a third conductive sub-line located in the first conductive layer 2A and a fourth conductive sub-line located in the second conductive layer 2C.

An orthogonal projection of the third conductive sub-line on a reference plane overlaps with an orthogonal projection of the fourth conductive sub-line on the reference plane, and the third conductive sub-line is electrically connected to the fourth conductive sub-line through via holes in the insulating layer 2B. The reference plane is a plane where the touch structure 300 is located. For example, the reference plane is the light exit surface 201 of the display panel 200. Herein, the via holes connecting the third conductive sub-line and the fourth conductive sub-line are referred to as fourth via holes.

In some exemplary embodiments, one third conductive line 31 crosses another third conductive line 31. The third conductive sub-line of one of the two crossing third conductive lines 31 is provided with a third break at a crossing position, the fourth conductive sub-line of the other third conductive line 11 is provided with a fourth break at the crossing position. In this way, cross-wiring of two third conductive lines 31 may be achieved on a basis that the thickness of the touch structure 300 does not increase, and each third conductive line 31 has a double-layer wiring structure in non-crossing regions, so that performance of signal transmission may be ensured.

In some other embodiments, the third conductive line 31 has a single-layer structure. For example, a plurality of third conductive lines 31 are disposed in one of the first conductive layer 2A and the second conductive layer 2C.

In some exemplary embodiments, one third conductive line 31 is arranged to cross another third conductive line 31. One of the two crossing third conductive lines 31 is disconnected at the crossing position, and the two disconnected portions are electrically connected through one bridge portion. An insulating portion is provided between the bridge portion and the other of the two third conductive lines 31 crossing each other. The bridge portion is provided in the other of the first conductive layer 2A and the second conductive layer 2C, and a portion of the insulating layer 2B located at the crossing position serves as the insulating portion.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A touch structure having a touch area and a peripheral area surrounding the touch area, the peripheral area including: a first peripheral sub-area and a second peripheral sub-area opposite to each other, and a third peripheral sub-area, both ends of the third peripheral sub-area being respectively connected to the first peripheral sub-area and the second peripheral sub-area; the touch structure further having a bonding region located in the second peripheral sub-area; the touch structure comprising:
   a plurality of first touch units extending in a first direction and a plurality of second touch units extending in a second direction, the plurality of first touch units and the plurality of second touch units being located in the touch area; the first direction intersecting with the second direction;
   a first conductive line group located in the touch area including a plurality of first conductive lines, each first conductive line being electrically connected to one of the plurality of first touch units, the first conductive line being led out from the third peripheral sub-area and extending to the bonding region, wherein the first conductive line includes a first conductive sub-line and a second conductive sub-line located in different layers in a thickness direction of the touch structure and electrically connected, an orthogonal projection of the first conductive sub-line on a reference plane overlaps with an orthogonal projection of the second conductive sub-line on the reference plane, the reference plane is a plane where the touch structure is located;
   an insulating layer located between a layer where the first conductive sub-line is located and a layer where the second conductive sub-line is located; wherein the first conductive sub-line is electrically connected to the second conductive sub-line through via holes provided in the insulating layer; and
   a second conductive line group located in the touch area including at least one second conductive line, each second conductive line being electrically connected to one of the plurality of second touch units, the second conductive line being led out from the first peripheral sub-area, passing through the third peripheral sub-area and extending to the bonding region; part of the second conductive line group located in the third peripheral sub-area being further away from the touch area than part of the first conductive line group located in the third peripheral sub-area; wherein
   in the plurality of first conductive lines, at least one first conductive line is further away from the touch area in the first direction than another first conductive line, and a lead-out position of the at least one first conductive line is closer to the second peripheral sub-area than a lead-out position of the another first conductive line.

2. The touch structure according to claim 1, wherein in any two first conductive lines of the first conductive line group, one first conductive line having a lead-out position closer to the second peripheral sub-area is further away from the touch area in the first direction than another first conductive line.

3. The touch structure according to claim 1, wherein the first conductive line includes: a first lead-out section, a first extension section and a first connection section sequentially connected;
   an end of the first lead-out section away from the first extension section is electrically connected to the first touch unit, the first extension section extends in the third peripheral sub-area, and the first connection section extends to the bonding region.

4. The touch structure according to claim 3, wherein in any two first conductive lines of the first conductive line group, a first extension section of one first conductive line having a lead-out position closer to the second peripheral sub-area is further away from the touch area in the first direction than a first extension section of another first conductive line; and
   lengths of first extension sections of the plurality first conductive lines increase in a direction from the third peripheral sub-area to the touch area.

5. The touch structure of claim 4, wherein lengths of first lead-out sections of the plurality of first conductive lines increase in a direction from the first peripheral sub-area to the second peripheral sub-area.

6. The touch structure according to claim 5, wherein in the any two first conductive lines of the first conductive line group, a first lead-out section of the one first conductive line having the lead-out position closer to the second peripheral sub-area and the first extension section of the another first conductive line cross and are insulated from each other.

7. The touch structure according to claim 3, wherein in any two first conductive lines of the first conductive line group, a first connection section of one first conductive line having a lead-out position closer to the second peripheral sub-area is further away from the touch area in the second direction than a first connection section of another first conductive line.

8. The touch structure according to claim 1, wherein the at least one first conductive line crosses the another first conductive line:
in two crossing first conductive lines, a first conductive sub-line of one first conductive line has a first break at a crossing position, and a second conductive sub-line of another first conductive line has a second break at the crossing position.

9. A touch structure having a touch area and a peripheral area surrounding the touch area, the peripheral area including: a first peripheral sub-area and a second peripheral sub-area opposite to each other, and a third peripheral sub-area, both ends of the third peripheral sub-area being respectively connected to the first peripheral sub-area and the second peripheral sub-area; the touch structure further having a bonding region located in the second peripheral sub-area; the touch structure comprising:
a plurality of first touch units extending in a first direction and a plurality of second touch units extending in a second direction, the plurality of first touch units and the plurality of second touch units being located in the touch area; the first direction intersecting with the second direction;
a first conductive line group located in the touch area including a plurality of first conductive lines, each first conductive line being electrically connected to one of the plurality of first touch units, the first conductive line being led out from the third peripheral sub-area and extending to the bonding region;
a second conductive line group located in the touch area including at least one second conductive line, each second conductive line being electrically connected to one of the plurality of second touch units, the second conductive line being led out from the first peripheral sub-area, passing through the third peripheral sub-area and extending to the bonding region; part of the second conductive line group located in the third peripheral sub-area being further away from the touch area than part of the first conductive line group located in the third peripheral sub-area;
at least one bridge portion; and
at least one insulating portion; wherein
in the plurality of first conductive lines, at least one first conductive line is further away from the touch area in the first direction than another first conductive line, and a lead-out position of the at least one first conductive line is closer to the second peripheral sub-area than a lead-out position of the another first conductive line;
the at least one first conductive line crosses the another first conductive line;
in two crossing first conductive lines, one first conductive line is disconnected at a crossing position, and two disconnected portions of the one first conductive line are electrically connected through a respective bridge portion of the at least one bridge portion; and
a respective one of the at least one insulating portion is provided between the bridge portion and another of the two crossing first conductive lines.

10. The touch structure according to claim 1, further comprising a first isolation line arranged between the first conductive line group and the second conductive line group, at least portion of the first isolation line extending in the third peripheral sub-area.

11. The touch structure according to claim 1, wherein the peripheral area further includes a fourth peripheral sub-area opposite to the third peripheral sub-area;
the touch structure further comprises a third conductive line group including a plurality of third conductive lines, each third conductive line being electrically connected to one of the plurality of first touch units, the third conductive line being led out from the fourth peripheral sub-area and extending to the bonding region.

12. The touch structure according to claim 11, further comprising a fourth conductive line group including at least one fourth conductive line, each fourth conductive line being electrically connected to one of the plurality of second touch units, the fourth conductive line being led out from the first peripheral sub-area, passing through the fourth peripheral sub-area and extending to the bonding region; wherein
a portion of the fourth conductive line group located in the fourth peripheral sub-area is further away from the touch area than a portion of the third conductive line group located in the fourth peripheral sub-area.

13. The touch structure according to claim 12, wherein in any two third conductive lines of the third conductive line group, one third conductive line having a lead-out position closer to the second peripheral sub-area is further away from the touch area in the first direction than another third conductive line.

14. The touch structure according to claim 13, wherein the third conductive line includes a second lead-out section, a second extension section and a second connection section sequentially connected; an end of the second lead-out section away from the second extension section is electrically connected to the first, touch unit, the second extension section extends in the fourth peripheral sub-area, and the second connection section extends to the bonding region;
in the any two third conductive lines of the third conductive line group, a second extension section of the one third conductive line having the lead-out position closer to the second peripheral sub-area is further away from the touch area in the first direction than a second extension section of the another third conductive line, and a second lead-out section of the one third conductive line having the lead-out position closer to the second peripheral sub-area and the second extension section of the another third conductive line cross and are insulated from each other;
lengths of second extension sections of the plurality third conductive lines increase in a direction from the fourth peripheral sub-area to the touch area; and
lengths of second lead-out sections of the plurality of third conductive lines increase in a direction from the first peripheral sub-area to the second peripheral sub-area.

15. The touch structure according to claim 12, further comprising a second isolation line arranged between the third conductive line group and the fourth conductive line group, at least portion of the second isolation line extending in the fourth peripheral sub-area.

16. The touch structure of claim 1, wherein the at least one second conductive line includes a plurality of second conductive lines, each of the plurality second touch units is electrically connected to a respective one of the plurality second conductive lines.

17. The touch structure according to claim 1, further comprising a fifth conductive line group including a plurality of fifth conductive lines, each fifth conductive line being electrically connected to an end of one of the plurality of second touch unit proximate to the second peripheral sub-area, the fifth conductive line being led out from the second peripheral area and extending to the bonding region.

18. A display apparatus, comprising:
   a display panel having a light exit surface; and
   the touch structure according to claim 1, the touch structure being disposed on the light exit surface, or disposed in the display panel and proximate to the light exit surface.

19. The touch structure according to claim 9, wherein a layer where the plurality of first conductive lines are located and a layer where the at least one bridge portion are located are stacked in a thickness direction of the touch structure;
   the touch structure further comprises an insulating layer disposed in the two layers, a portion of the insulating layer located at a crossing position serving as one of the at least one insulating portion.

\* \* \* \* \*